United States Patent
Oh et al.

(10) Patent No.: US 10,256,387 B2
(45) Date of Patent: Apr. 9, 2019

(54) LIGHT EMITTING DIODE

(71) Applicant: Seoul Viosys Co., Ltd., Ansan-si (KR)

(72) Inventors: Se Hee Oh, Ansan-si (KR); Mae Yi Kim, Ansan-si (KR); Seom Geun Lee, Ansan-si (KR); Myoung Hak Yang, Ansan-si (KR); Yeo Jin Yoon, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 0 days.

(21) Appl. No.: 15/663,219

(22) Filed: Jul. 28, 2017

(65) Prior Publication Data

US 2017/0331020 A1    Nov. 16, 2017

Related U.S. Application Data

(63) Continuation of application No. 15/147,619, filed on May 5, 2016, now Pat. No. 9,735,329, which is a
(Continued)

(30) Foreign Application Priority Data

Dec. 21, 2012  (KR) .................. 10-2012-0150388
Mar. 19, 2013  (KR) .................. 10-2013-0029136
(Continued)

(51) Int. Cl.
*H01L 27/15*    (2006.01)
*H01L 33/08*    (2010.01)
(Continued)

(52) U.S. Cl.
CPC ............. *H01L 33/62* (2013.01); *H01L 27/15* (2013.01); *H01L 27/156* (2013.01); *H01L 33/08* (2013.01);
(Continued)

(58) Field of Classification Search
None
See application file for complete search history.

(56) References Cited

U.S. PATENT DOCUMENTS 7,417,259 B2    8/2008    Sakai
7,709,849 B1    5/2010    Kal et al.
(Continued)

FOREIGN PATENT DOCUMENTS

CN    102132429    7/2011
CN    102169941    8/2011
(Continued)

OTHER PUBLICATIONS

Notice of Allowance dated Apr. 15, 2015, in U.S. Appl. No. 14/135,925.
(Continued)

*Primary Examiner* — Erik Kielin
(74) *Attorney, Agent, or Firm* — H.C. Park & Associates, PLC

(57) ABSTRACT

A light emitting diode including a first light emitting cell and a second light emitting cell separated from each other on a substrate, a first transparent electrode layer electrically connected to the first light emitting cell, an interconnection electrically connecting the first light emitting cell to the second light emitting cell, and a first insulation layer. The first transparent electrode layer is disposed on an upper surface of the first light emitting cell and partially covers a side surface of the first light emitting cell. The first insulation layer separates the first transparent electrode layer from the side surface of the first light emitting cell, and includes an opening to expose a lower semiconductor layer of the first light emitting cell.

9 Claims, 18 Drawing Sheets

Related U.S. Application Data continuation-in-part of application No. 14/459,887, filed on Aug. 14, 2014, now Pat. No. 9,356,212, which is a continuation-in-part of application No. 14/135,925, filed on Dec. 20, 2013, now Pat. No. 9,093,627.

(30) Foreign Application Priority Data

| | | |
|---|---|---|
| Mar. 27, 2013 | (KR) | 10-2013-0032481 |
| Aug. 16, 2013 | (KR) | 10-2013-0097078 |
| Aug. 16, 2013 | (KR) | 10-2013-0097079 |
| Aug. 11, 2014 | (KR) | 10-2014-0103815 |

(51) Int. Cl.

| | |
|---|---|
| *H01L 33/14* | (2010.01) |
| *H01L 33/38* | (2010.01) |
| *H01L 33/42* | (2010.01) |
| *H01L 33/62* | (2010.01) |

(52) U.S. Cl.

CPC .......... *H01L 33/385* (2013.01); *H01L 33/387* (2013.01); *H01L 33/42* (2013.01); *H01L 33/14* (2013.01); *H01L 2924/0002* (2013.01)

(56) References Cited

U.S. PATENT DOCUMENTS

| | | |
|---|---|---|
| 9,196,605 B2 | 11/2015 | Shen et al. |
| 9,202,973 B2 | 12/2015 | Kim et al. |
| 2008/0230765 A1 | 9/2008 | Yoon et al. |
| 2009/0121237 A1 | 5/2009 | Murofushi et al. |
| 2009/0272991 A1 | 11/2009 | Lee et al. |
| 2010/0059768 A1 | 3/2010 | Hasnain |
| 2010/0102337 A1 | 4/2010 | Lee et al. |
| 2010/0252840 A1 | 10/2010 | Ibbetson et al. |
| 2011/0127549 A1 | 6/2011 | Lee et al. |
| 2011/0204387 A1 | 8/2011 | Kim et al. |
| 2011/0210352 A1 | 9/2011 | Lee et al. |
| 2012/0049234 A1 | 3/2012 | Cheng |
| 2012/0061694 A1 | 3/2012 | Shen et al. |
| 2012/0080691 A1 | 4/2012 | Hung et al. |
| 2013/0032815 A1 | 2/2013 | Hung et al. |
| 2013/0105827 A1 | 5/2013 | Kim et al. |
| 2013/0234172 A1 | 9/2013 | Yeh |
| 2014/0034976 A1 | 2/2014 | Chu et al. |
| 2014/0061680 A1 | 3/2014 | Schubert |
| 2014/0159071 A1 | 6/2014 | Choi et al. |
| 2015/0325621 A1 | 11/2015 | Kim et al. |
| 2015/0372207 A1* | 12/2015 | Kim .................. H01L 33/62 257/98 |

FOREIGN PATENT DOCUMENTS

| | | |
|---|---|---|
| CN | 103026516 | 4/2013 |
| CN | 103855180 | 6/2014 |
| CN | 204167323 | 2/2015 |
| EP | 2362420 | 8/2011 |
| KR | 10-0690323 | 2/2007 |
| KR | 10-0966372 | 6/2010 |
| KR | 10-1186684 | 9/2012 |
| TW | 201208056 | 2/2012 |
| TW | 201238079 | 9/2012 |
| TW | 201244171 | 11/2012 |
| WO | 2004/023568 | 3/2004 |

OTHER PUBLICATIONS

Notice of Allowance dated Nov. 6, 2015, in U.S. Appl. No. 14/791,824.
Non-Final Office Action dated May 11, 2015, in U.S. Appl. No. 14/459,887.
Final Office Action dated Oct. 8, 2015, in U.S. Appl. No. 14/459,887.
Notice of Allowance dated Jan. 25, 2016, in U.S. Appl. No. 14/459,887.
Notice of Allowance dated Jun. 12, 2015, in U.S. Appl. No. 14/135,925.
Notice of Allowance dated Oct. 7, 2016, in U.S. Appl. No. 15/150,863.
Chinese Office Action dated Oct. 9, 2016 issued in Chinese Patent Application No. 201410406657.8 with English Translation.
Notice of Allowance dated Dec. 13, 2016, in U.S. Appl. No. 15/150,863.
Taiwanese Office Action dated Jan. 26, 2017, in Taiwanese application No. 102147821.
Non-Final Office Action dated Oct. 6, 2016, in U.S. Appl. No. 15/147,619.
Non-Final Office Action dated Jan. 26, 2017 in U.S. Appl. No. 15/147,619.
Notice of Allowance dated Mar. 31, 2017, in U.S. Appl. No. 15/147,619.

* cited by examiner

LIGHT EMITTING DIODE

CROSS-REFERENCE TO RELATED APPLICATIONS

This application is a continuation of U.S. patent application Ser. No. 15/147,619, filed on May 5, 2016, which is a divisional of U.S. application Ser. No. 14/459,887, filed on Aug. 14, 2014, now U.S. Pat. No. 9,356,212, which is a continuation-in-part of U.S. application Ser. No. 14/135,925, filed on Dec. 20, 2013, now U.S. Pat. No. 9,093,627, and claims priority from and the benefit of Korean Patent Application Nos. 10-2012-0150388, filed on Dec. 21, 2012, 10-2013-0029136, filed on Mar. 19, 2013, 10-2013-0032481, filed on Mar. 27, 2013, 10-2013-0097078, filed on Aug. 16, 2013, 10-2013-0097079, filed on Aug. 16, 2013, and 10-2014-0103815, filed on Aug. 11, 2014, which are hereby incorporated by reference for all purposes as if fully set forth herein.

BACKGROUND

Field

The present invention relates to a light emitting diode and a method of fabricating the same, and more particularly, to a light emitting diode including a plurality of light emitting cells connected to each other via interconnections on a single substrate, and a method of fabricating the same.

Discussion of the Background

Gallium nitride (GaN) based light emitting diodes (LEDs) have been used in a wide range of applications including full color LED displays, LED traffic sign boards, white LEDs, etc. In recent years, with higher luminous efficacy than existing fluorescent lamps, white light emitting diodes are expected to overtake existing fluorescent lamps in the field of general lighting.

A light emitting diode may be driven to emit light by forward current and require a supply of direct current. Thus, when the light emitting diode is directly connected to an alternating current (AC) source, the light emitting diode repeats on/off operation dependent upon a direction of electric current, and cannot continuously emit light and may be easily damaged by reverse current.

To solve such problems of a light emitting diode, WO 2004/023568 (A1) of Sakai et. al., entitled "LIGHT-EMITTING DEVICE HAVING LIGHT-EMITTING ELEMENTS", discloses a light emitting diode which can be used through direct connection to a high voltage AC source.

The AC light emitting diode of WO 2004/023568 (A1) includes a plurality of light emitting elements connected to each other via an air bridge interconnection to be driven by an AC source. Such an air-bridge interconnection may be easily broken by external force and may cause short circuit due to deformation by external force.

To solve such a drawback of the air bridge interconnection, AC light emitting diodes are disclosed in Korean Patent Nos. 10-069023 and 10-1186684, for example.

FIG. 1 is a schematic plan view of a typical light emitting diode including a plurality of light emitting cells, and FIG. 2 and FIG. 3 are sectional views taken along line A-A of FIG. 1.

Referring to FIG. 1 and FIG. 2, the light emitting diode includes a substrate 21, a plurality of light emitting cells 26 including S1, S2, a transparent electrode layer 31, an insulation layer 33, and an interconnection 35. In addition, each of the light emitting cells 26 includes a lower semiconductor layer 25, an active layer 27, and an upper semiconductor layer 29, and a buffer layer 23 may be interposed between the substrate 21 and the light emitting cells 26.

The light emitting cells 26 are formed by patterning the lower semiconductor layer 25, active layer 27, and upper semiconductor layer 29 grown on the substrate 21, and the transparent electrode layer 31 is formed on each of the light emitting cells S1, S2. In each of the light emitting cells 26, an upper surface of the lower semiconductor layer 25 is partially exposed by partially removing the active layer 27 and the upper semiconductor layer 29 for connection to the interconnection 35.

Next, the insulation layer 33 is formed to cover the light emitting cells 26. The insulation layer 33 includes a side insulation layer 33a covering side surfaces of the light emitting cells 26 and an insulation protective layer 33b covering the transparent electrode layer 31. The insulation layer 33 is formed with an opening through which a portion of the transparent electrode layer 31 is exposed and an opening through which the lower semiconductor layer 25 is exposed. Then, the interconnection 35 is formed on the insulation layer 33, in which a first connection section 35p of the interconnection 35 is connected to the transparent electrode layer 31 of one light emitting cell S1 through the opening of the insulation layer 33, and a second connection section 35n of the interconnection 35 is connected to the lower semiconductor layer 25 of another light emitting cell S2 adjacent the one light emitting cell S1 through the other opening of the insulation layer 33. The second connection section 35n is connected to an upper surface of the lower semiconductor layer 25, which is exposed by partially removing the active layer 27 and the upper semiconductor layer 29.

In a conventional technique, the interconnection 35 is formed on the insulation layer 33 and thus may be prevented from deformation by external force. In addition, since the interconnection 35 is separated from the light emitting cells 26 by the side insulation layer 33a, it is possible to prevent short circuit of the light emitting cells 26 by the interconnection 35.

However, such a conventional light emitting diode may have a limit in current spreading in areas of the light emitting cells 26. Specifically, electric current may be concentrated under one end of the interconnection 35 connected to the transparent electrode layer 31 instead of being evenly spread in the areas of the light emitting cells 26. Current crowding may become severe with increasing current density.

Moreover, such a conventional light emitting diode may have problems in that some of the light generated in the active layer 27 may be absorbed and lost by the interconnection 35, and the thickness of the insulation layer 33 may need to be increased to prevent formation of defects such as pin-holes and the like.

Furthermore, since a portion of the upper surface of the lower semiconductor layer 25 is exposed for electric connection of the second connection section 35n, the active layer 27 and the upper semiconductor layer 29 are partially removed, and may thereby reduce an effective light emitting area.

In order to prevent current crowding, a current blocking layer 30 may be disposed between the transparent electrode layer 31 and the light emitting cells 26 to prevent current crowding under the connection end of the interconnection 35.

FIG. 3 is a sectional view of a light emitting diode including a current blocking layer 30 in the related art.

Referring to FIG. 1 and FIG. 3, the current blocking layer 30 is disposed under the connection end of the interconnection 35, and may thereby prevent current crowding under the connection end of the interconnection 35. In addition, the current blocking layer 30 may be formed as a reflector such as a distributed Bragg reflector, and may thereby prevent light generated in the active layer 27 from being absorbed into the connection end of the interconnection 35.

However, when the current blocking layer 30 is additionally formed as shown in FIG. 3, a photolithography process for forming the current blocking layer 30 is added, and may thereby increase manufacturing costs.

Moreover, as in the light emitting diode of FIG. 2, the light emitting diode of FIG. 3 may also have problems, such as optical loss due to absorption of light generated in the active layer 27 by the interconnection 35, reduction in effective light emitting area, and increase in thickness of the insulation layer 33 to prevent defects such as pinholes in the insulation layer 33.

SUMMARY OF THE INVENTION

Exemplary embodiments of the present invention provide a light emitting diode, which may employ a first insulation layer having an opening to expose a lower semiconductor layer to form an ohmic contact region.

Exemplary embodiments of the present invention also provide a light emitting diode capable of reducing absorption of light by an interconnection.

Exemplary embodiments of the present invention also provide a light emitting diode, which includes a plurality of light emitting cells each having an increased effective light emitting area.

Additional features of the invention will be set forth in the description which follows, and in part will be apparent from the description, or may be learned by practice of the invention.

An exemplary embodiment of the present invention provides a light emitting diode, the light emitting diode including a first light emitting cell and a second light emitting cell separated from each other on a substrate, a first transparent electrode layer electrically connected to the first light emitting cell, an interconnection electrically connecting the first light emitting cell to the second light emitting cell, and a first insulation layer. The first transparent electrode layer is disposed on an upper surface of the first light emitting cell to be connected to the first light emitting cell while at least partially covering a side surface of the first light emitting cell. The first insulation layer separates the first transparent electrode layer from the side surface of the first light emitting cell, and the first insulation layer includes an opening configured to expose a lower semiconductor layer of the first light emitting cell.

A second insulation layer may be disposed between the interconnection and the upper surface of the first light emitting cell The second insulation layer may include the same material as the first insulation layer.

The second insulation layer may be disposed under the first transparent electrode layer; and the interconnection may be connected to the first transparent electrode layer.

The first transparent electrode layer may cover three side surfaces of the first light emitting cell.

A portion of the first transparent electrode layer may partially cover a side surface of the second light emitting cell.

Each of the first and second light emitting cells may have a lower semiconductor layer, an upper semiconductor layer, and an active layer disposed between the lower semiconductor layer and the upper semiconductor layer. The first transparent electrode layer may be electrically connected to the upper semiconductor layer, a first end of the interconnection may be electrically connected to the first transparent electrode layer, and a second end of the interconnection may be electrically connected to the lower semiconductor layer of the second light emitting cell.

The interconnection may be directly connected to the first transparent electrode layer without an insulating material disposed over the entirety of an overlapping region therebetween.

A second insulation layer may be disposed on the upper semiconductor layer of the first light emitting cell, wherein the second insulation layer is disposed below a region to which the first transparent electrode layer and the interconnection are connected to the upper semiconductor layer of the first light emitting cell.

The first light emitting cell and the second light emitting cell may have the same structure.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
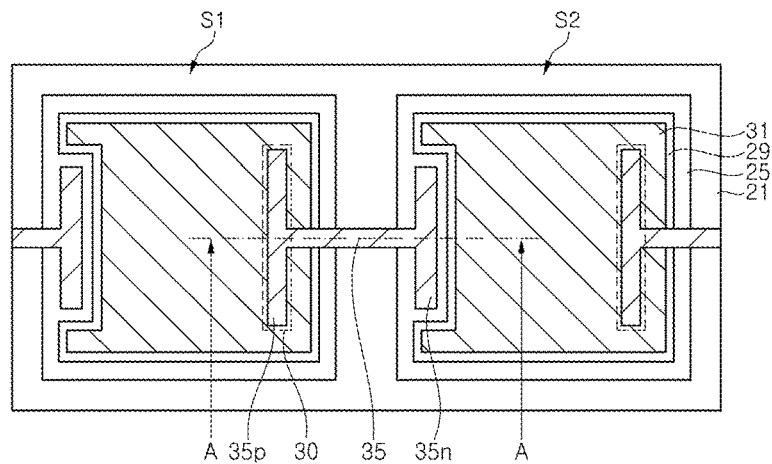
FIG. 1 is a schematic plan view of a light emitting diode in the related art.
Figure 2:
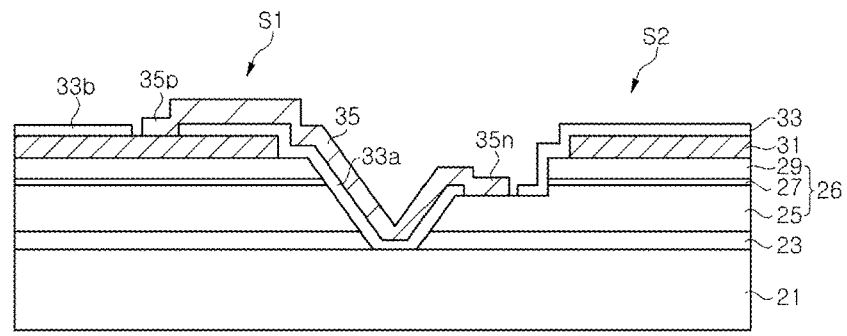
FIG. 2 and FIG. 3 are schematic sectional views taken along line A-A of FIG. 1.
Figure 3:
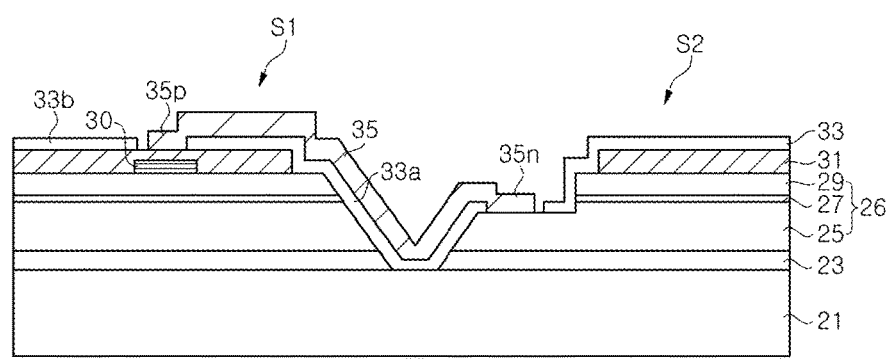

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present. It will be understood that for the purposes of this disclosure, "at least one of X, Y, and Z" can be construed as X only, Y only, Z only, or any combination of two or more items X, Y, and Z (e.g., XYZ, XYY, YZ, ZZ).

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Figure 4:
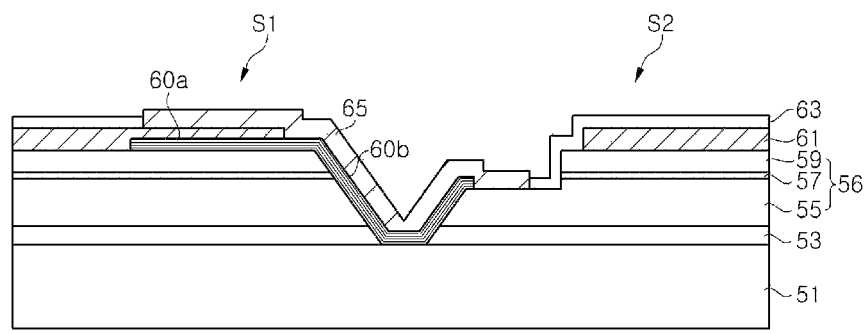
FIG. 4 is a schematic sectional view of a light emitting diode according to an exemplary embodiment of the present invention.

FIG. 4 is a schematic sectional view of a light emitting diode according to an exemplary embodiment of the present invention.

Referring to FIG. 4, a light emitting diode according to one embodiment of the invention includes a substrate 51, light emitting cells S1, S2, a transparent electrode layer 61, a current blocking layer 60a, an insulation layer 60b, an insulation protective layer 63, and an interconnection 65. The light emitting diode may further include a buffer layer 53.

The substrate 51 may be an insulating or conductive substrate. For example, the substrate 51 may be a sapphire substrate, a gallium nitride substrate, a silicon carbide (SiC) substrate, or a silicon substrate. On a single substrate 51, the first light emitting cell S1 and the second light emitting cell S2 are separated from each other. Each of the first and second light emitting cells S1, S2 has a stack structure 56, which includes a lower semiconductor layer 55, an upper semiconductor layer 59 disposed on one area of the lower semiconductor layer, and an active layer 57 interposed between the lower semiconductor layer and the upper semiconductor layer. Here, the upper and lower semiconductor layers may be p-type and n-type semiconductor layers, respectively, or vice versa.

Each of the lower semiconductor layer 55, the active layer 57 and the upper semiconductor layer 59 may be formed of a gallium nitride-based material, for example, (Al, In, Ga)N. The active layer 57 may be formed of a material having a composition capable of emitting light in a desired wavelength range, for example, UV or blue light, and the lower and upper semiconductor layers 55, 59 are formed of a material having a wider band gap than that of the active layer 57.

As shown, the lower semiconductor layer 55 and/or the upper semiconductor layer 59 may be formed of a single layer or multiple layers. In addition, the active layer 57 may have a single quantum-well structure or a multi-quantum well structure.

Each of the first and second light emitting cells S1, S2 may have an inclined side surface, an inclined angle of which ranges from 15° to 80° with respect to an upper surface of the substrate 51. Although not shown, the lower semiconductor layer 55 may have a stepped portion formed along a sidewall thereof.

The active layer 57 and the upper semiconductor layer 59 are disposed on some area of the lower semiconductor layer 55, and the other area of the lower semiconductor layer 55 is exposed as shown in FIG. 4. Although the side surfaces of the active layer 57 and upper semiconductor layer 59 are shown as being vertical side surfaces in FIG. 4, it should be understood that these side surfaces may also be inclined.

In FIG. 4, the first light emitting cell S1 and the second light emitting cell S2 are partially shown. However, it should be noted that the first light emitting cell S1 and the second light emitting cell S2 have a similar or the same structure. Specifically, the first and second light emitting cells S1, S2 have the same stack structure, and some area of the lower semiconductor layer 55 of the first light emitting cell S1 is exposed as in some area of the lower semiconductor layer 55 of the second light emitting cell S2.

The buffer layer 53 may be interposed between the light emitting cells S1, S2 and the substrate 51. The buffer layer 53 is used to relieve lattice mismatch between the substrate 51 and the lower semiconductor layer 55 when the substrate 51 is a growth substrate.

The transparent electrode layer 61 is disposed on each of the light emitting cells S1, S2. Specifically, a first transparent electrode layer 61 is disposed on the first light emitting cell S1, and a second transparent electrode layer 61 is disposed on the second light emitting cell S2. The transparent electrode layer 61 may be disposed on an upper surface of the upper semiconductor layer 59 to be connected to the upper semiconductor layer 59, and may have a smaller area than that of the upper semiconductor layer 59. In other words, the transparent electrode layer 61 may be recessed from an edge of the upper semiconductor layer 59. Thus, the light emitting diode according to this embodiment may prevent current crowding at the edge of the transparent electrode layer 61 through the sidewalls of the light emitting cells S1, S2.

The current blocking layer 60a may be disposed on each of the light emitting cells S1, S2 between the transparent electrode layer 61 and each of the light emitting cells S1, S2. Particularly, the current blocking layer 60a is disposed near one edge of the first light emitting cell S1, and a portion of the transparent electrode layer 61 is disposed on the current blocking layer 60a. The current blocking layer 60a is formed of an insulation material, and particularly, may include a distributed Bragg reflector formed by alternately stacking layers having different indices of refraction.

The insulation layer 60b covers a portion of the side surface of the first light emitting cell S1. As shown in FIG. 4, the insulation layer 60b extends to cover a portion of a side surface of the lower semiconductor layer 55 of the second light emitting cell S2. The insulation layer 60b has the same structure as that of the current blocking layer 60a and is formed of the same material as that of the current blocking layer 60a, and may include a distributed Bragg reflector. When the insulation layer 60b includes the distributed Bragg reflector formed of multiple layers, it is possible to efficiently suppress formation of defects such as pinholes in the insulation layer 60b. Alternatively, the insulation layer 60b may be separated from the current blocking layer 60a.

The interconnection 65 electrically connects the first light emitting cell S1 to the second light emitting cell S2. The interconnection 65 is electrically connected at one end thereof to the transparent electrode layer 61 on the first light emitting cell S1 and at the other end thereof to the lower semiconductor layer 55 of the second light emitting cell S2, whereby the first light emitting cell S1 can be directly connected in series to the second light emitting cell S2.

The interconnection 65 may contact the transparent electrode layer 61 over an entire overlapping area between the interconnection 65 and the transparent electrode layer 61. In the related art, a portion of the insulation layer 33 is disposed between the transparent electrode layer 31 and the interconnection 35. However, in this embodiment, the interconnection 65 directly contacts the transparent electrode layer 61 without any insulating material interposed therebetween.

Further, the current blocking layer 60a may be disposed over an entire overlapping area between the interconnection 65 and the transparent electrode layer 61, and the current blocking layer 60a and the insulation layer 60b may be disposed over an entire overlapping area between the interconnection 65 and the first light emitting cell S1. In addition, the insulation layer 60b may be disposed between the second light emitting cell S2 and the interconnection 65 except for a connection area between the interconnection 65 and the second light emitting cell S2.

When the current blocking layer 60a and the insulation layer 60b have reflective characteristics like distributed Bragg reflectors, the current blocking layer 60a and the insulation layer 60b may be substantially within the same area as that of the interconnection 65 in an area two times or less than that of the interconnection 65. The current blocking layer 60a and the insulation layer 60b prevent absorption of light by the interconnection 65 when light is emitted from the active layer 57. However, when the current blocking layer 60a and the insulation layer 60b occupy an excessively large area, there is a possibility of blocking discharge of light. Thus, it may be necessary to limit the area of the current blocking layer 60a and the insulation layer 60b.

The insulation protective layer 63 may be disposed outside the area of the interconnection 65. The insulation protective layer 63 covers the first and second light emitting cells S1, S2 outside the area of the interconnection 65. The insulation protective layer 63 may be formed of a silicon oxide layer (SiO2) or a silicon nitride layer. The insulation protective layer 63 is formed with an opening through which the transparent electrode layer 61 on the first light emitting cell S1 and the lower semiconductor layer of the second light emitting cell S2 are exposed, and the interconnection 65 may be disposed within this opening.

A side surface of the insulation protective layer 63 and a side surface of the interconnection 65 may be disposed to face each other, or to contact each other. Alternatively, the side surface of the insulation protective layer 63 may be separated from the side surface of the interconnection 65 to face each other.

According to this embodiment, the current blocking layer 60a and the insulation layer 60b may be formed of the same material and have the same structure, and thus may be formed by the same process. In addition, since the interconnection 65 is disposed within the opening of the insulation protective layer 63, the insulation protective layer 63 and the interconnection 65 may be formed using the same mask pattern.

In this embodiment, the light emitting diode is illustrated as including two light emitting cells, that is, the first light emitting cell S1 and the second light emitting cell S2. However, the present invention is not limited to the two light emitting cells, and more light emitting cells may be electrically connected to each other by interconnections 65. For example, the interconnections 65 may electrically connect the lower semiconductor layers 55 of adjacent light emitting cells to the transparent electrode layers 61 thereof to form a series array of the light emitting cells. The light emitting diode according to this embodiment may include a plurality of such arrays, which is connected to each other in reverse parallel and connected to an AC source. In addition, the light emitting diode may be provided with a bridge rectifier (not shown) connected to the series array of light emitting cells, such that the light emitting cells can be driven by an AC source. The bridge rectifier may be formed by connecting the light emitting cells having the same structure as that of the light emitting cells S1, S2 using the interconnections 65.

FIG. 5 to FIG. 11 are sectional views illustrating a method of fabricating a light emitting diode according to one embodiment of the present invention.

Figure 5:
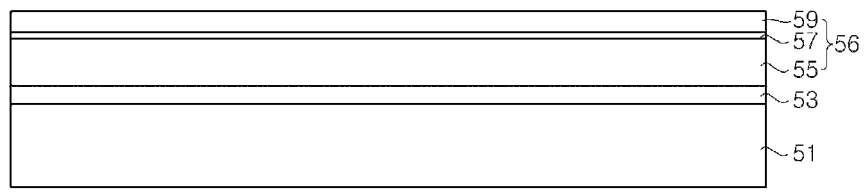
FIG. 5, FIG. 6, FIG. 7, FIG. 8, FIG. 9, FIG. 10, and FIG. 11 are schematic sectional views illustrating a method of fabricating a light emitting diode according to the exemplary embodiment of FIG. 4.

Referring to FIG. 5, a semiconductor stack structure 56 is formed on a substrate 51, and includes a lower semiconductor layer 55, an active layer 57 and an upper semiconductor layer 59. In addition, before formation of the lower semiconductor layer 55, a buffer layer 53 may be formed on the substrate 51.

The substrate 51 may be a sapphire (Al2O3) substrate, a silicon carbide (SiC) substrate, a zinc oxide (ZnO) substrate, a silicon (Si) substrate, a gallium arsenide (GaAs), a gallium phosphide (GaP) substrate, a lithium alumina (LiAl2O3) substrate, a boron nitride (BN) substrate, an aluminum nitride (AlN) substrate, or a gallium nitride (GaN) substrate, without being limited thereto. That is, the substrate 51 may be selected from among various materials dependent upon materials of semiconductor layers to be formed thereon.

The buffer layer 53 is formed to relieve lattice mismatch between the substrate 51 and the lower semiconductor layer 55 formed thereon, and may be formed of, for example, gallium nitride (GaN) or aluminum nitride (AlN). When the substrate 51 is a conductive substrate, the buffer layer 53 may be formed as an insulation layer or a semi-insulation layer, for example, AlN or semi-insulation GaN.

Each of the lower semiconductor layer 55, the active layer 57 and the upper semiconductor layer 59 may be formed of a gallium nitride-based semiconductor material, for example, (Al, In, Ga)N. The lower and upper semiconductor layers 55, 59 and the active layer 57 may be discontinuously or continuously formed by metal organic chemical vapor deposition (MOCVD), molecular beam epitaxy, hydride vapor phase epitaxy (HYPE), and the like.

Here, the lower and upper semiconductor layers are n-type and p-type semiconductor layers, respectively, or vice versa. The n-type semiconductor layer is formed by doping a gallium nitride-based compound semiconductor layer with, for example, silicon (Si) impurities, and the p-type semiconductor layer is formed by doping the gallium nitride-based compound semiconductor layer with, for example, magnesium (Mg) impurities.

Figure 6:
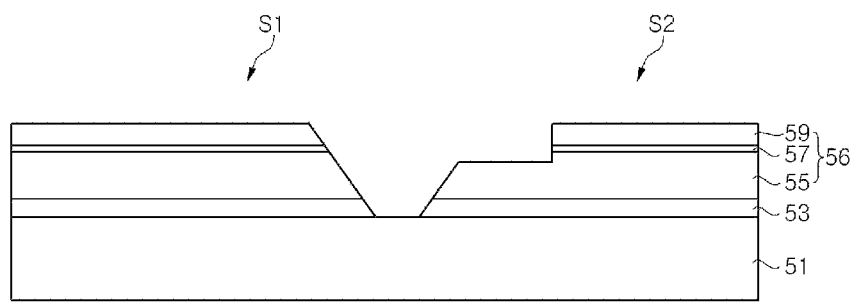

Referring to FIG. 6, a plurality of light emitting cells S1, S2 is formed to be separated from each other by photolithography and etching. Each of the light emitting cells S1, S2 has an inclined side surface, and the lower semiconductor layer 55 of each of the light emitting cells S1, S2 is partially exposed.

In each of the light emitting cells S1, S2, the lower semiconductor layer 55 is first exposed by mesa-etching, and the light emitting cells are separated from each other by a cell isolation process. Alternatively, the light emitting cells S1, S2 may be first separated from each other by the cell isolation process, and then are subjected to mesa etching to expose the lower semiconductor layers 55 thereof.

Figure 7:
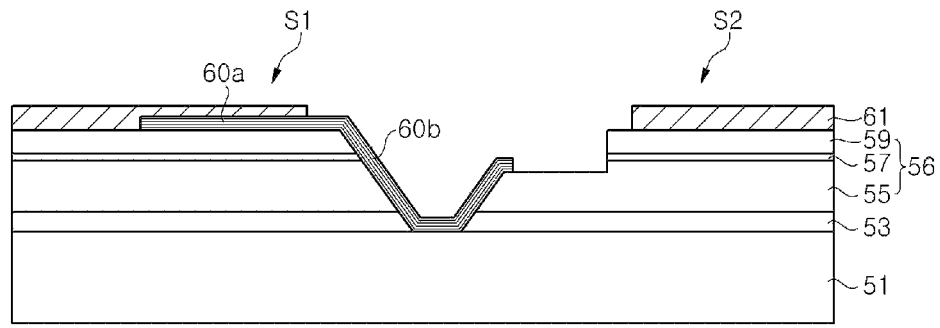

Referring to FIG. 7, a current blocking layer 60*a* covering a partial area of the first light emitting cell S1 is formed together with an insulation layer 60*b* covering a partial area of a side surface of the first light emitting cell S1. The insulation layer 60*b* may also extend to cover a portion of a side surface of the lower semiconductor layer 55 of the second light emitting cell S2.

The current blocking layer 60*a* and the insulation layer 60*b* may be formed by depositing an insulation material layer, followed by patterning the insulation material layer through photolithography and etching. Alternatively, the current blocking layer 60*a* and the insulation layer 60*b* may be formed of an insulation material through a lift-off process. In particular, the current blocking layer 60*a* and the insulation layer 60*b* may be formed as distributed Bragg reflectors by alternately stacking layers having different indices of refraction, for example, a $SiO_2$ layer and a $TiO_2$ layer. When the insulation layer 60*b* is a distributed Bragg reflector formed of multiple layers, it is possible to prevent formation of defects such as pinholes in the insulation layer 60*b*, whereby the insulation layer 60*b* may be formed to be relatively thin as compared with conventional techniques.

As shown in FIG. 7, the current blocking layer 60*a* and the insulation layer 60*b* may be connected to each other, without being limited thereto.

Next, a transparent electrode layer 61 is formed on the first and second light emitting cells S1, S2. The transparent electrode layer 61 may be formed of a conductive material such as indium tin oxide (ITO) or zinc oxide, or a metal layer such as Ni/Au. The transparent electrode layer 61 is connected to the upper semiconductor layer 59 and is partially disposed on the current blocking layer 60*a*. The transparent electrode layer 61 may be formed by a lift-off process, without being limited thereto. Alternatively, the transparent electrode layer 61 may be formed by photolithography and etching.

Figure 8:
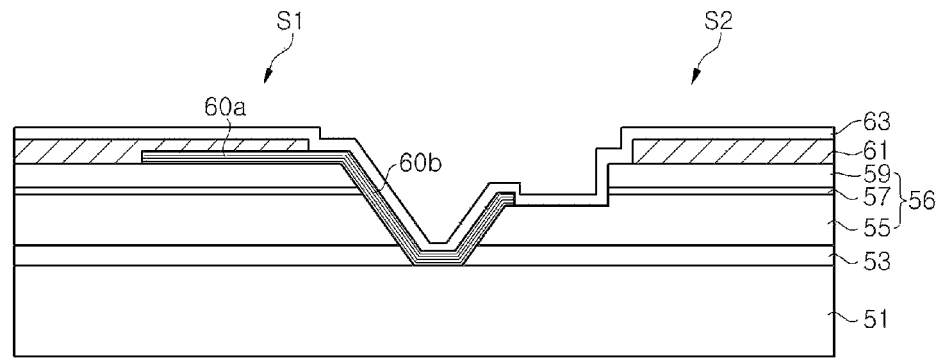

Referring to FIG. 8, an insulation protective layer 63 is formed to cover the first and second light emitting cells S1, S2. The insulation protective layer 63 covers the transparent electrode layer 61 and the insulation layer 60*b*. In addition, the insulation protective layer 63 may cover an overall area of the first and second light emitting cells S1, S2. The insulation protective layer 63 may be formed as an insulation material layer such as a silicon oxide layer or a silicon nitride layer by chemical vapor deposition or the like.

Figure 9:
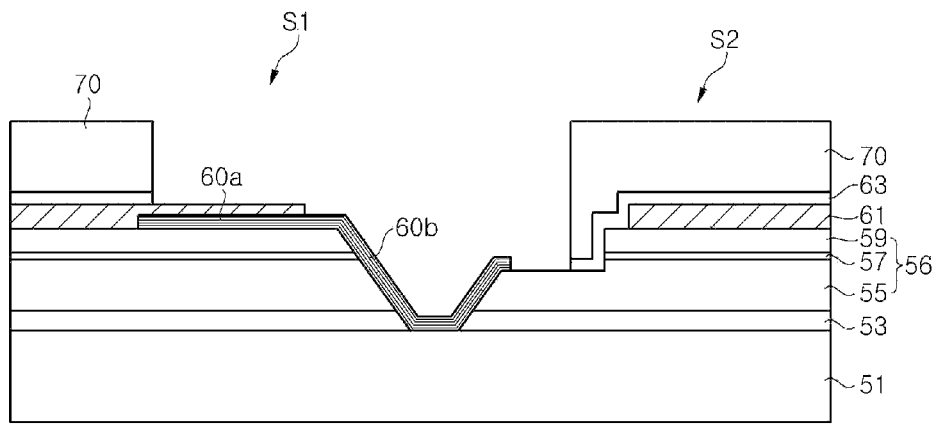

Referring to FIG. 9, a mask pattern 70 having an opening is formed on the insulation protective layer 63. The opening of the mask pattern 70 corresponds to an area of the interconnection. Next, some region of the insulation protective layer 63 is etched using the mask pattern 70 as a mask. As a result, an opening is formed in the insulation protective layer 63 to expose some of the transparent electrode layer 61 and the insulation layer 60*b*, and the lower semiconductor layer 55 of the second light emitting cell S2 therethrough.

Figure 10:
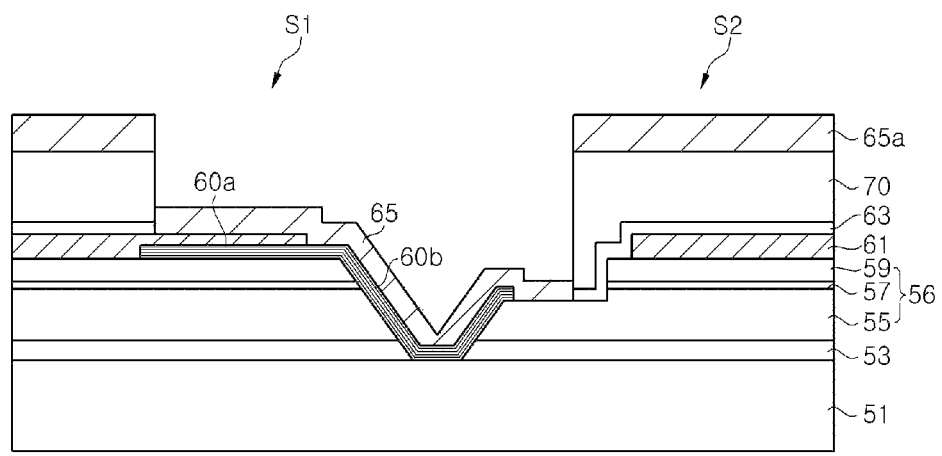

Referring to FIG. 10, with the mask pattern 70 remaining on the insulation protective layer 63, a conductive material is deposited to form an interconnection 65 in the opening of the mask pattern 70. At this point, a portion 65*a* of the conductive material may be deposited on the mask pattern 70. The conductive material may be deposited by plating, electron-beam evaporation or sputtering.

Figure 11:
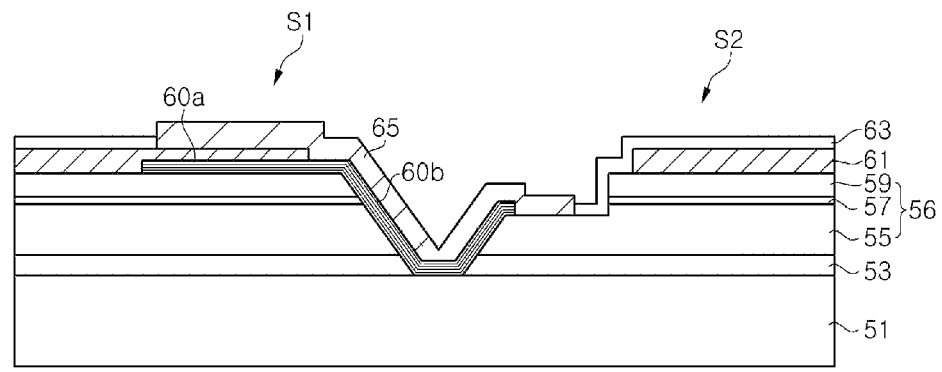

Referring to FIG. 11, the mask pattern 70 is removed together with the portion 65*a* of the conductive material on the mask pattern 70. Accordingly, the interconnection 65 electrically connecting the first and second light emitting cells S1, S2 to each other is finally formed.

Here, one end of the interconnection 65 is connected to the transparent electrode layer 61 of the first light emitting cell S1, and the other end thereof to the lower semiconductor layer 55 of the second light emitting cell S2. In addition, the one end of the interconnection 65 is connected to the transparent electrode layer 61 within an upper area of the current blocking layer 60*a*. The interconnection 65 is separated from the side surface of the first light emitting cell S1 and the side surface of the second light emitting cell S2 via the insulation layer 60*b*. Furthermore, the interconnection 65 is disposed within the upper area of the current blocking layer 60*a* and the insulation layer 60*b* except for a portion of the interconnection 65 electrically connected to the lower semiconductor layer 55 of the second light emitting cell S2.

In this embodiment, the current blocking layer 60*a* and the insulation layer 60*b* are formed by the same process. Accordingly, the insulation protective layer 63 and the interconnection 65 may be formed using the same mask pattern 70, whereby the light emitting diode can be fabricated using the same number of exposure processes while adding the current blocking layer 60*a*.

Figure 12:
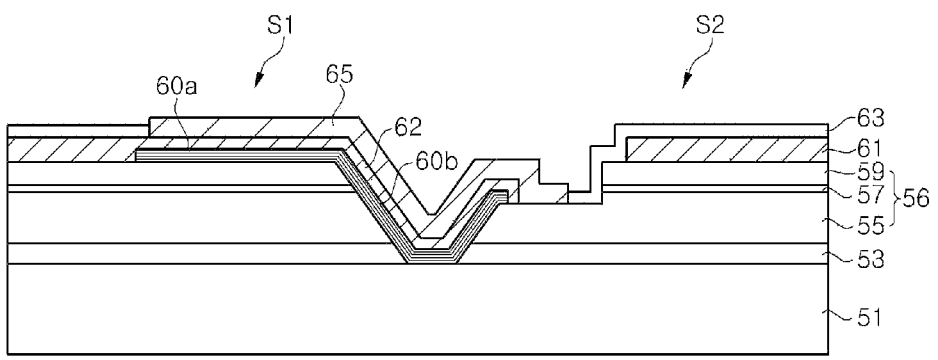
FIG. 12 is a schematic sectional view of a light emitting diode according to an exemplary embodiment of the present invention.

FIG. 12 is a schematic sectional view of a light emitting diode according to an exemplary embodiment of the present invention.

Referring to FIG. 12, the light emitting diode according to this embodiment is generally similar to the light emitting diode described with reference to FIG. 4, and further includes a transparent conductive layer 62.

In the light emitting diode according to this embodiment, a substrate 51, light emitting cells S1, S2, a buffer layer 53, a transparent electrode layer 61, a current blocking layer 60a, an insulation layer 60b, an insulation protective layer 63 and an interconnection 65 are similar to those of the light emitting diode according to the above embodiment described with reference to FIG. 4, and detailed descriptions thereof will be omitted.

The transparent conductive layer 62 is disposed between the insulation layer 60b and the interconnection 65. The transparent conductive layer 62 has a narrower line width than the insulation layer 60b, thereby preventing short circuit of the upper semiconductor layer 59 and the lower semiconductor layer 55 due to the transparent conductive layer 62. That is, when the insulation layer 60b is thicker than the transparent conductive layer 62, the insulation layer 60b may prevent a short circuit.

On the other hand, the transparent conductive layer 62 is connected to the first transparent electrode layer 61, and may connect the first transparent electrode layer 61 to the second light emitting cell S2. For example, one end of the transparent conductive layer 62 may be electrically connected to the lower semiconductor layer 55 of the second light emitting cell. In addition, when two or more light emitting cells are connected to each other, a second transparent conductive layer 62 may extend from a second transparent conductive layer 61 on the second light emitting cell S2.

In this embodiment, since the transparent conductive layer 62 is disposed between the interconnection 65 and the insulation layer 60b, electric current can flow through the transparent conductive layer 62 even in the case where the interconnection 65 is disconnected, thereby improving electrical stability of the light emitting diode.

FIG. 13 to FIG. 16 are schematic sectional views illustrating a method of fabricating a light emitting diode according to the present exemplary embodiment.

Figure 13:
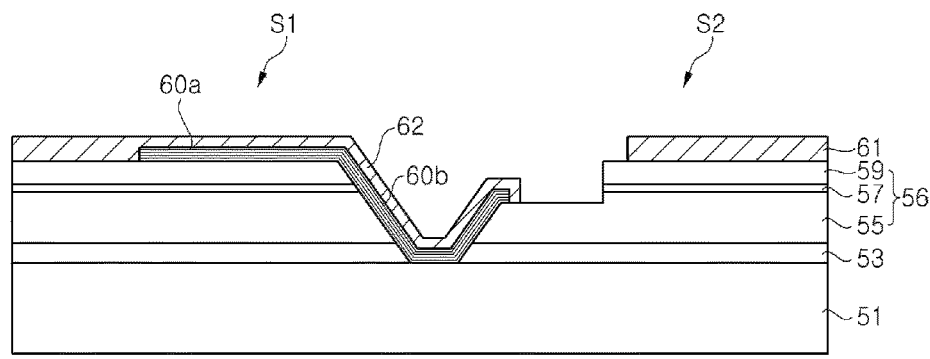
FIG. 13, FIG. 14, FIG. 15, and FIG. 16 are schematic sectional views illustrating a method of fabricating a light emitting diode according to the exemplary embodiment of FIG. 12.

Referring to FIG. 13, as in the method described with reference to FIG. 5 and FIG. 6, a semiconductor stack structure 56 is formed on a substrate 51 and a plurality of light emitting cells S1, S2 is formed to be separated from each other via photolithography and etching. Then, as described with reference to FIG. 7, a current blocking layer 60a covering a partial area of the first light emitting cell S1 is formed together with an insulation layer 60b covering a partial area of a side surface of the first light emitting cell S1. The insulation layer 60b may also extend to cover a portion of a side surface of the lower semiconductor layer 55 of the second light emitting cell S2.

As described with reference to FIG. 7, the current blocking layer 60a and the insulation layer 60b may be formed as distributed Bragg reflectors by alternately stacking layers having different indices of refraction, for example, a $SiO_2$ layer and a $TiO_2$ layer. When the insulation layer 60b is a distributed Bragg reflector formed of multiple layers, it is possible to prevent formation of defects such as pinholes in the insulation layer 60b, whereby the insulation layer 60b may be formed to be relatively thin as compared with conventional techniques.

Next, a transparent electrode layer 61 is formed on the first and second light emitting cells S1, S2. As described with reference to FIG. 7, the transparent electrode layer 61 may be formed of a conductive material such as indium tin oxide (ITO) or zinc oxide, or a metal layer such as Ni/Au. The transparent electrode layer 61 is connected to the upper semiconductor layer 59 and is partially disposed on the current blocking layer 60a. The transparent electrode layer 61 may be formed by a lift-off process, without being limited thereto. Alternatively, the transparent electrode layer 61 may be formed by photolithography and etching.

During formation of the transparent electrode layer 61, a transparent conductive layer 62 is also formed. The transparent conductive layer 62 may be formed of the same material as that of the transparent electrode layer 61 through the same process. The transparent conductive layer 62 is formed on the insulation layer 60b, and may be connected to the transparent electrode layer 61. Further, one end of the transparent conductive layer 62 may be electrically connected to the lower semiconductor layer 55 of the second light emitting cell S2.

Figure 14:
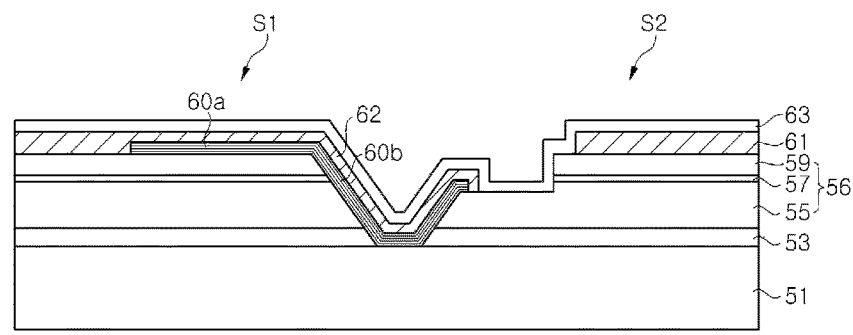

Referring to FIG. 14, an insulation protective layer 63 is formed to cover the first and second light emitting cells S1, S2. The insulation protective layer 63 covers the transparent electrode layer 61, the transparent conductive layer 62 and the insulation layer 60b. In addition, the insulation protective layer 63 may cover an overall area of the first and second light emitting cells S1, S2. The insulation protective layer 63 may be formed as an insulation material layer such as a silicon oxide layer or a silicon nitride layer by chemical vapor deposition or the like.

Figure 15:
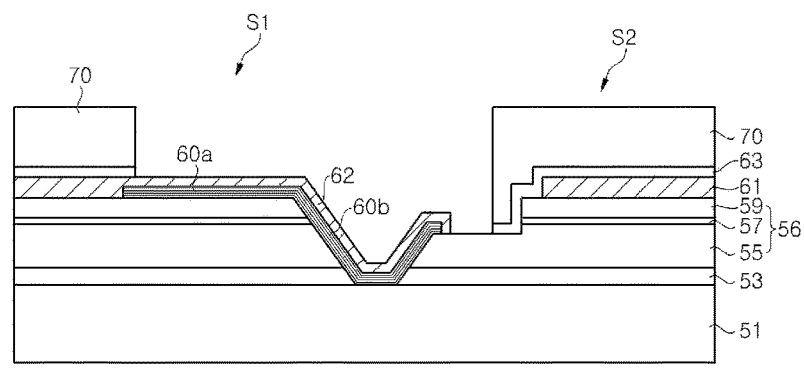

Referring to FIG. 15, as described with reference to FIG. 9, a mask pattern 70 having an opening is formed on the insulation protective layer 63. The opening of the mask pattern 70 corresponds to an area of the interconnection. Next, some region of the insulation protective layer 63 is etched using the mask pattern 70 as a mask. As a result, an opening is formed in the insulation protective layer 63 to expose some of the transparent electrode layer 61 and the transparent conductive layer 62, and the lower semiconductor layer 55 of the second light emitting cell S2 therethrough. Further, a portion of the insulation layer 60b is exposed through the opening.

Figure 16:
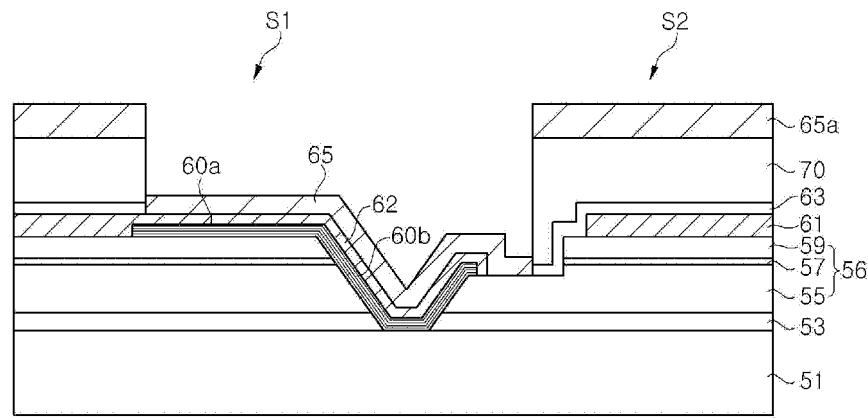

Referring to FIG. 16, as described with reference to FIG. 10, with the mask pattern 70 remaining on the insulation protective layer 63, a conductive material is deposited to form an interconnection 65 in the opening of the mask pattern 70.

Next, as described with reference to FIG. 11, the mask pattern 70 is removed together with a portion 65a of the conductive material on the mask pattern 70. Accordingly, the interconnection 65 electrically connecting the first and second light emitting cells S1, S2 to each other is finally formed.

In the embodiment described with reference to FIG. 5 to FIG. 11, the insulation layer 60b may be damaged during etching of the insulation protective layer 63. For example, when the insulation protective layer 63 is subjected to etching using an etching solution such as fluoric acid, the insulation layer 60b including an oxide layer may be damaged by the etching solution. Thus, the insulation layer 60b may not insulate the interconnection 65 from the first light emitting cell S1, thereby causing short circuit.

On the contrary, in the present exemplary embodiment, since the transparent conductive layer 62 is disposed on the insulation layer 60b, the insulation layer 60b under the transparent conductive layer 62 can be protected from etching damage. Thus, it is possible to prevent short circuit due to the interconnection 65.

In the present exemplary embodiment, the transparent electrode layer 61 and the transparent conductive layer 62 may be formed by the same process. Thus, the light emitting diode can be fabricated using the same number of exposure processes while adding the transparent conductive layer 62.

Figure 17:
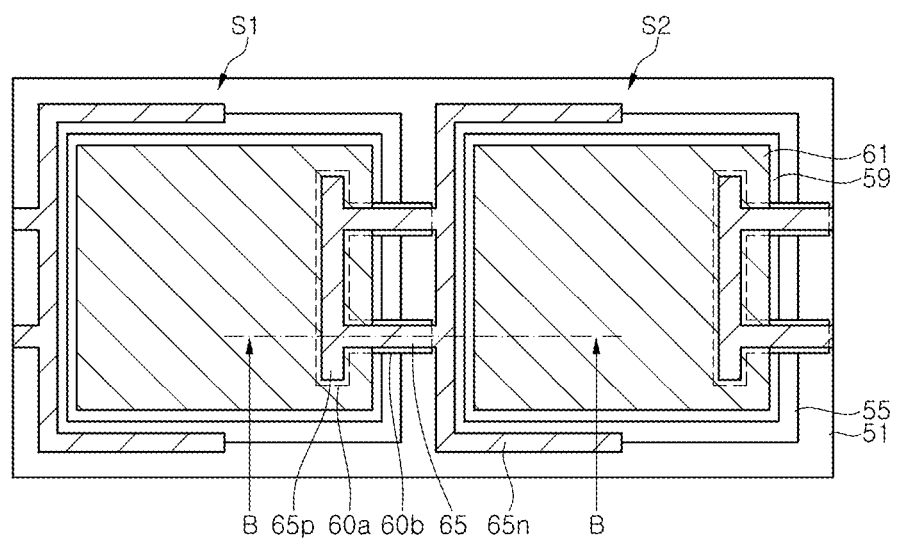
FIG. 17 is a schematic plan view of a light emitting diode according to an exemplary embodiment of the present invention.
Figure 18:
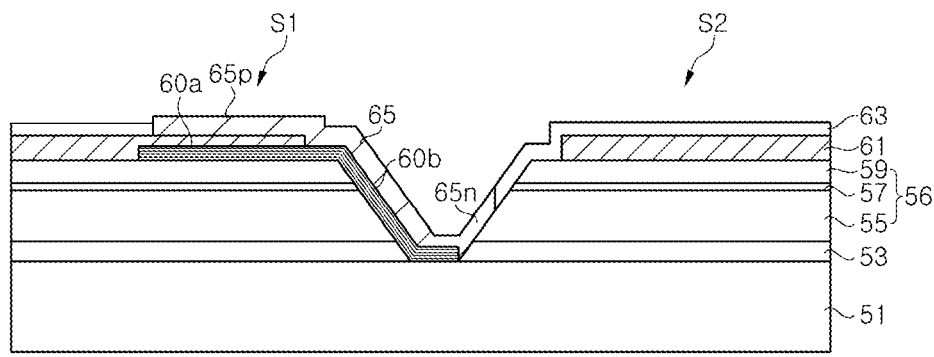
FIG. 18 is a schematic sectional view taken along line B-B of FIG. 17.

FIG. 17 is a schematic plan view of a light emitting diode according to an exemplary embodiment of the present invention, and FIG. 18 is a schematic sectional view taken along line B-B of FIG. 17.

Referring to FIG. 17 and FIG. 18, the light emitting diode includes a substrate 51, light emitting cells S1, S2, a transparent electrode layer 61, a current blocking layer 60a, an insulation layer 60b, an insulation protective layer 63, and an interconnection 65. The light emitting diode may further include a buffer layer 53.

The substrate 51 may be an insulating or conductive substrate. For example, the substrate 51 may be a sapphire substrate, a gallium nitride substrate, a silicon carbide (SiC) substrate, or a silicon substrate. In addition, the substrate 51 may be a substrate having a convex-concave pattern (not shown) on an upper surface thereof, such as a patterned sapphire substrate.

On a single substrate 51, the first light emitting cell S1 and the second light emitting cell S2 are separated from each other. Each of the first and second light emitting cells S1, S2 has a stack structure 56, which includes a lower semiconductor layer 55, an upper semiconductor layer 59 disposed on one area of the lower semiconductor layer, and an active layer 57 interposed between the lower semiconductor layer and the upper semiconductor layer. Here, the upper and lower semiconductor layers may be p-type and n-type semiconductor layers, respectively, or vice versa.

Each of the lower semiconductor layer 55, the active layer 57 and the upper semiconductor layer 59 may be formed of a gallium nitride-based material, for example, (Al, In, Ga)N. The active layer 57 may be formed of a material having a composition capable of emitting light in a desired wavelength range, for example, UV or blue light, and the lower and upper semiconductor layers 55, 59 are formed of a material having a wider band gap than that of the active layer 57.

As shown, the lower semiconductor layer 55 and/or the upper semiconductor layer 59 may be formed of a single layer or multiple layers. In addition, the active layer 57 may have a single quantum-well structure or a multi-quantum well structure.

Each of the first and second light emitting cells S1, S2 may have an inclined side surface, an inclined angle of which ranges from 15° to 80° with respect to an upper surface of the substrate 51.

The active layer 57 and the upper semiconductor layer 59 are disposed on the lower semiconductor layer 55. An upper surface of the lower semiconductor layer 55 may be completely covered by the active layer 57 such that the side surface of the lower semiconductor layer 55 can be exposed.

In FIG. 18, the first light emitting cell S1 and the second light emitting cell S2 are partially shown. However, it should be noted that the first light emitting cell S1 and the second light emitting cell S2 have a similar or the same structure as shown in FIG. 17. Specifically, the first and second light emitting cells S1, S2 have the same gallium nitride-based semiconductor stack structure, and may have inclined side surfaces of the same structure.

The buffer layer 53 may be interposed between the light emitting cells S1, S2 and the substrate 51. The buffer layer 53 is used to relieve lattice mismatch between the substrate 51 and the lower semiconductor layer 55 formed thereon when the substrate 51 is a growth substrate.

The transparent electrode layer 61 is disposed on each of the light emitting cells S1, S2. Specifically, a first transparent electrode layer 61 is disposed on the first light emitting cell S1, and a second transparent electrode layer 61 is disposed on the second light emitting cell S2. The transparent electrode layer 61 may be disposed on an upper surface of the upper semiconductor layer 59 to be connected to the upper semiconductor layer 59, and may have a smaller area than that of the upper semiconductor layer 59. In other words, the transparent electrode layer 61 may be recessed from an edge of the upper semiconductor layer 59. Thus, the light emitting diode according to this embodiment may prevent current crowding at the edge of the transparent electrode layer 61 through the sidewalls of the light emitting cells S1, S2.

The current blocking layer 60a may be disposed on each of the light emitting cells S1, S2 between the transparent electrode layer 61 and each of the light emitting cells S1, S2. A portion of the transparent electrode layer 61 is disposed on the current blocking layer 60a. The current blocking layer 60a may be disposed near an edge of each of the light emitting cells S1, S2, without being limited thereto. Alternatively, the current blocking layer 60a may be disposed at a central region of each of the light emitting cells S1, S2. The current blocking layer 60a is formed of an insulation material, and particularly, may include a distributed Bragg reflector formed by alternately stacking layers having different indices of refraction.

The insulation layer 60b covers a portion of the side surface of the first light emitting cell S1. As shown in FIG. 17 and FIG. 18, the insulation layer 60b may extend to an area between the first light emitting cell S1 and the second light emitting cell S2, and may cover a portion of the side surface of the lower semiconductor layer 55 of the second light emitting cell S2. The insulation layer 60b has the same structure as that of the current blocking layer 60a and is formed of the same material as that of the current blocking layer 60a, and may include a distributed Bragg reflector. The insulation layer 60b may be formed of a different process than that of the current blocking layer 60a. When the insulation layer 60b includes the distributed Bragg reflector formed of multiple layers, it is possible to efficiently suppress formation of defects such as pinholes in the insulation layer 60b. The insulation layer 60b may be directly connected to the current blocking layer 60a to be positioned adjacent thereto, but is not limited thereto. The insulation layer 60b may be separated from the current blocking layer 60a.

The interconnection 65 electrically connects the first light emitting cell S1 to the second light emitting cell S2. The interconnection 65 includes a first connection section 65p and a second connection section 65n. The first connection section 65p is electrically connected to the transparent electrode layer 61 on the first light emitting cell S1, and the second connection section 65n is electrically connected to the lower semiconductor layer 55 of the second light emitting cell S2. The first connection section 65p may be disposed near one edge of the first light emitting cell S1, without being limited thereto. Alternatively, the first connection section 65p may be disposed at the central region of the first light emitting cell S1.

The second connection section 65n may contact an inclined side surface of the second light emitting cell S2, particularly, an inclined side surface of the lower semiconductor layer 55 of the second light emitting cell S2. In addition, as shown in FIG. 17, the second connection section 65n may extend in opposite directions along the periphery of the second light emitting cell S2 while electrically contacting the inclined side surface of the lower semiconductor layer 55. The first light emitting cell S1 is connected in series to the second light emitting cell S2 by the first and second connection sections 65p, 65n of the interconnection 65.

The interconnection 65 may contact the transparent electrode layer 61 over an entire overlapping area between the interconnection 65 and the transparent electrode layer 61. In the related art, a portion of the insulation layer 33 may be disposed between the transparent electrode layer 31 and the interconnection 35. However, in the present exemplary embodiment, the interconnection 65 directly contacts the transparent electrode layer 61 without any insulating material interposed therebetween.

Further, the current blocking layer 60a may be disposed over the entire overlapping area between the interconnection 65 and the transparent electrode layer 61, and the current blocking layer 60a and the insulation layer 60b may be disposed over an entire overlapping area between the interconnection 65 and the first light emitting cell S1. In addition, the insulation layer 60b may be disposed between the second light emitting cell S2 and the interconnection 65 except for a connection area between the interconnection 65 and the second light emitting cell S2.

Although the first connection section 65p and the second connection section 65n of the interconnection 65 are illustrated as being connected to each other via two paths in FIG. 17, the first connection section 65p and the second connection section 65n may be connected to each other via a single path.

When the current blocking layer 60a and the insulation layer 60b have reflective characteristics like distributed Bragg reflectors, the current blocking layer 60a and the insulation layer 60b may be substantially within the same area as that of the interconnection 65 in an area two times or less than that of the interconnection 65. The current blocking layer 60a and the insulation layer 60b prevent absorption of light by the interconnection 65 when light is emitted from the active layer 57. However, when the current blocking layer 60a and the insulation layer 60b occupy an excessively large area, there is a possibility of blocking discharge of light. Thus, it may be necessary to limit the area of the current blocking layer 60a and the insulation layer 60b.

The insulation protective layer 63 may be disposed outside the area of the interconnection 65. The insulation protective layer 63 covers the first and second light emitting cells S1, S2 outside the area of the interconnection 65. The insulation protective layer 63 may be formed of a silicon oxide layer ($SiO_2$) or a silicon nitride layer. The insulation protective layer 63 is formed with an opening through which the transparent electrode layer 61 on the first light emitting cell S1 and the lower semiconductor layer of the second light emitting cell S2 are exposed, and the interconnection 65 may be disposed within this opening A side surface of the insulation protective layer 63 and a side surface of the interconnection 65 may be disposed to face each other, or to contact each other. Alternatively, the side surface of the insulation protective layer 63 may be separated from the side surface of is the interconnection 65 to face each other.

According to this embodiment, since the second connection section 65n of the interconnection 65 electrically contacts the inclined side surface of the second light emitting cell S2, there is no need for exposure of an upper surface of the lower semiconductor layer 55 of the second light emitting cell S2. Thus, there is no need for partial removal of the upper semiconductor layer 59 and the active layer 57, thereby increasing an effective light emitting area of the light emitting diode.

In addition, the current blocking layer 60a and the insulation layer 60b may be formed of the same material and have the same structure, and thus may be formed by the same process. Further, since the interconnection 65 is disposed within the opening of the insulation protective layer 63, the insulation protective layer 63 and the interconnection 65 may be formed using the same mask pattern.

In this embodiment, the light emitting diode is illustrated as including two light emitting cells, that is, the first light emitting cell S1 and the second light emitting cell S2. However, the present invention is not limited to the two light emitting cells, and more light emitting cells may be electrically connected to each other by interconnections 65. For example, the interconnections 65 may electrically connect the lower semiconductor layers 55 of adjacent light emitting cells to the transparent electrode layers 61 thereof to form a series array of the light emitting cells. The light emitting diode according to this embodiment may include a plurality of such arrays, which is connected to each other in reverse parallel and connected to an AC source. In addition, the light emitting diode may be provided with a bridge rectifier (not shown) connected to the series array of light emitting cells, such that the light emitting cells can be driven by an AC source. The bridge rectifier may be formed by connecting the light emitting cells having the same structure as that of the light emitting cells S1, S2 using the interconnections 65.

FIG. 19 to FIG. 25 are sectional views illustrating a method of fabricating a light emitting diode according to one embodiment of the invention.

Figure 19:
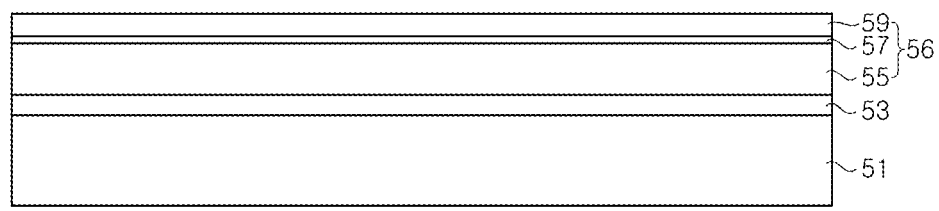
FIG. 19, FIG. 20, FIG. 21, FIG. 22, FIG. 23, FIG. 24, and to FIG. 25 are schematic sectional views illustrating a method of fabricating a light emitting diode according to the exemplary embodiment of FIG. 18.

Referring to FIG. 19, a semiconductor stack structure 56 is formed on a substrate 51, and includes a lower semiconductor layer 55, an active layer 57 and an upper semiconductor layer 59. In addition, before formation of the lower semiconductor layer 55, a buffer layer 53 may be formed on the substrate 51.

The substrate 51 may be a sapphire ($Al_2O_3$) substrate, a silicon carbide (SiC) substrate, a zinc oxide (ZnO) substrate, a silicon (Si) substrate, a gallium arsenide (GaAs), a gallium phosphide (GaP) substrate, a lithium alumina ($LiAl_2O_3$) substrate, a boron nitride (BN) substrate, an aluminum nitride (AlN) substrate, or a gallium nitride (GaN) substrate, without being limited thereto. That is, the substrate 51 may be selected from among various materials dependent upon materials of semiconductor layers to be formed thereon. In addition, the substrate 51 may be a substrate having a convex-concave pattern (not shown) on an upper surface thereof, such as a patterned sapphire substrate.

The buffer layer 53 is formed to relieve lattice mismatch between the substrate 51 and the lower semiconductor layer 55 formed thereon, and may be formed of, for example, gallium nitride (GaN) or aluminum nitride (AlN). When the substrate 51 is a conductive substrate, the buffer layer 53 may be formed as an insulation layer or a semi-insulation layer, for example, AlN or semi-insulation GaN.

Each of the lower semiconductor layer 55, the active layer 57 and the upper semiconductor layer 59 may be formed of a gallium nitride-based semiconductor material, for example, (Al, In, Ga)N. The lower and upper semiconductor layers 55, 59 and the active layer 57 may be discontinuously or continuously formed by metal organic chemical vapor deposition (MOCVD), molecular beam epitaxy, hydride vapor phase epitaxy (HYPE), and the like.

Here, the lower and upper semiconductor layers are n-type and p-type semiconductor layers, respectively, or vice versa. The n-type semiconductor layer is formed by doping a gallium nitride-based compound semiconductor layer with, for example, silicon (Si) impurities, and the p-type semiconductor layer is formed by doping the gallium nitride-based compound semiconductor layer with, for example, magnesium (Mg) impurities.

Figure 20:
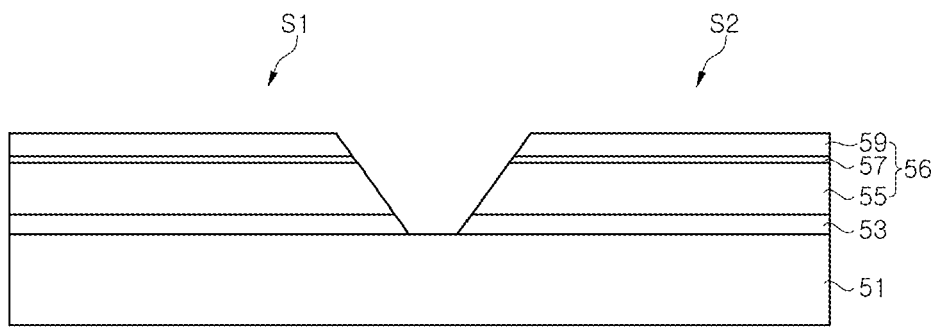

Referring to FIG. 20, a plurality of light emitting cells S1, S2 is formed to be separated from each other by photolithography and etching. Each of the light emitting cells S1, S2 has an inclined side surface. In a conventional method of fabricating a light emitting diode, photolithography and etching processes are added to expose a portion of an upper surface of the lower semiconductor layer 55 of each of the light emitting cells S1, S2. In this embodiment, however, the photolithography and etching processes for partially exposing the upper surface of the lower semiconductor layer 55 are omitted.

Figure 21:
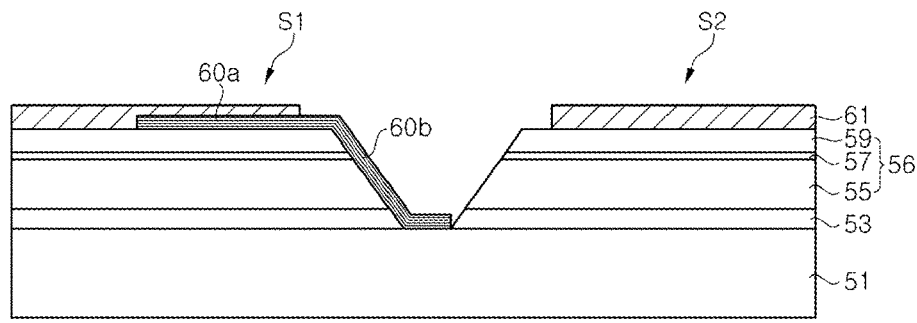

Referring to FIG. 21, a current blocking layer 60a covering a partial area of the first light emitting cell S1 is formed together with an insulation layer 60b covering a partial area of a side surface of the first light emitting cell S1. The insulation layer 60b may also extend to cover an area between the first light emitting cell S1 and the second light emitting cell S2, and may cover a portion of the side surface of the lower semiconductor layer 55 of the second light emitting cell S2.

The current blocking layer 60a and the insulation layer 60b may be formed by depositing an insulation material layer, followed by patterning the insulation material layer through photolithography and etching. Alternatively, the current blocking layer 60a and the insulation layer 60b may be formed as insulation material layers through a lift-off process. In particular, the current blocking layer 60a and the insulation layer 60b may be formed as distributed Bragg reflectors by alternately stacking layers having different indices of refraction, for example, a $SiO_2$ layer and a $TiO_2$ layer. When the insulation layer 60b is a distributed Bragg reflector formed of multiple layers, it is possible to prevent formation of defects such as pinholes in the insulation layer 60b, whereby the insulation layer 60b may be formed to be relatively thin as compared with conventional techniques.

As shown in FIG. 21, the current blocking layer 60a and the insulation layer 60b may be connected to each other, without being limited thereto.

Next, a transparent electrode layer 61 is formed on the first and second light emitting cells S1, S2. The transparent electrode layer 61 may be formed of a conductive material such as indium tin oxide (ITO) or zinc oxide, or a metal layer such as Ni/Au. The transparent electrode layer 61 is connected to the upper semiconductor layer 59 and is partially disposed on the current blocking layer 60a. The transparent electrode layer 61 may be formed by a lift-off process, without being limited thereto. Alternatively, the transparent electrode layer 61 may be formed by photolithography and etching.

Figure 22:
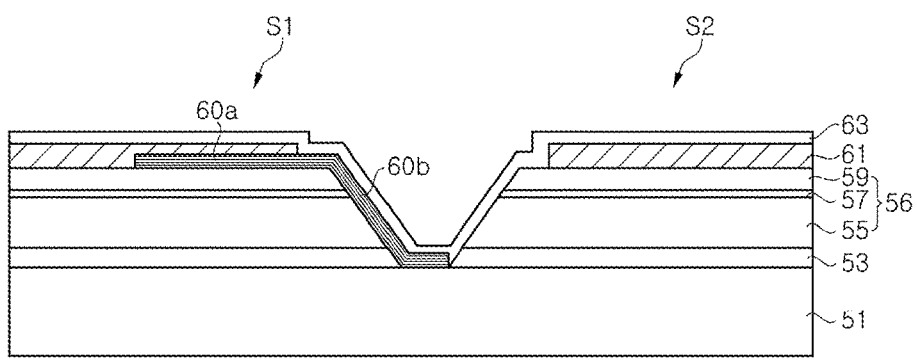

Referring to FIG. 22, an insulation protective layer 63 is formed to cover the first and second light emitting cells S1, S2. The insulation protective layer 63 covers the transparent electrode layer 61 and the insulation layer 60b. In addition, the insulation protective layer 63 may cover an overall area of the first and second light emitting cells S1, S2. The insulation protective layer 63 may be formed as an insulation material layer such as a silicon oxide layer or a silicon nitride layer by chemical vapor deposition or the like.

Figure 23:
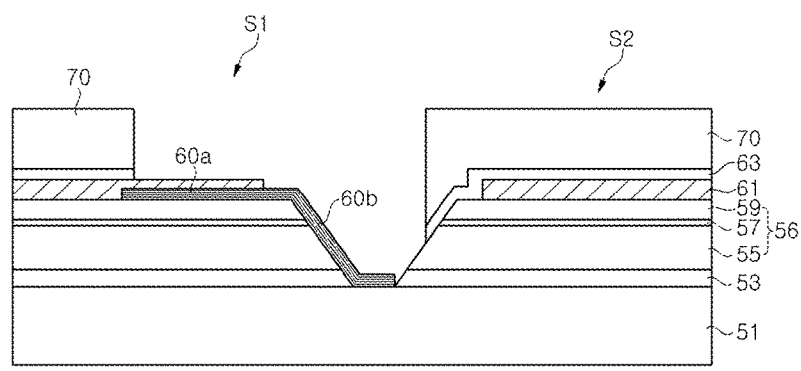

Referring to FIG. 23, a mask pattern 70 having an opening is formed on the insulation protective layer 63. The opening of the mask pattern 70 corresponds to an area of the interconnection. Next, some region of the insulation protective layer 63 is etched using the mask pattern 70 as a mask. As a result, an opening is formed in the insulation protective layer 63 to expose some of the transparent electrode layer 61 and the insulation layer 60b, and an inclined side surface of the lower semiconductor layer 55 of the second light emitting cell S2 therethrough.

Figure 24:
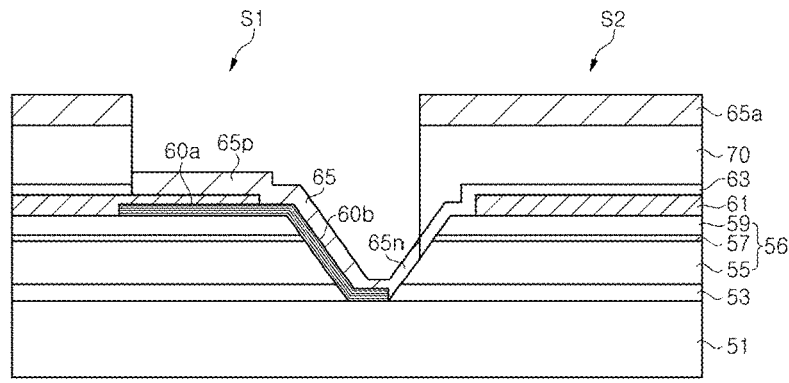

Referring to FIG. 24, with the mask pattern 70 remaining on the insulation protective layer 63, a conductive material is deposited to form an interconnection 65 in the opening of the mask pattern 70. At this point, a portion 65a of the conductive material may be deposited on the mask pattern 70. The conductive material may be deposited by plating, electron-beam evaporation or sputtering.

Figure 25:
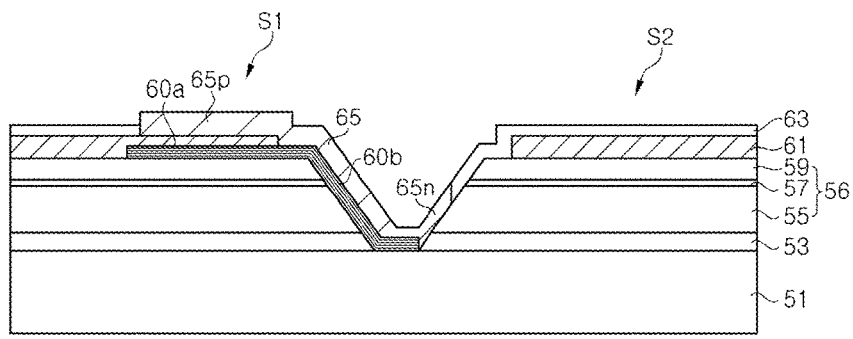

Referring to FIG. 25, the mask pattern 70 is removed together with the portion 65a of the conductive material on the mask pattern 70. Accordingly, the interconnection 65 electrically connecting the first and second light emitting cells S1, S2 to each other is finally formed.

Here, a first connection section 65p of the interconnection 65 is connected to the transparent electrode layer 61 of the first light emitting cell S1, and a second connection section 65n of the interconnection 65 is connected to the inclined side surface of the lower semiconductor layer 55 of the second light emitting cell S2. The first connection section 65p of the interconnection 65 is connected to the transparent electrode layer 61 within an upper area of the current blocking layer 60a. The interconnection 65 is separated from the side surface of the first light emitting cell S1 by the insulation layer 60b.

In this embodiment, the current blocking layer 60a and the insulation layer 60b are formed by the same process. Accordingly, the insulation protective layer 63 and the interconnection 65 may be formed using the same mask pattern 70, whereby the light emitting diode can be fabricated using the same number of exposure processes while adding the current blocking layer 60a.

Figure 26:
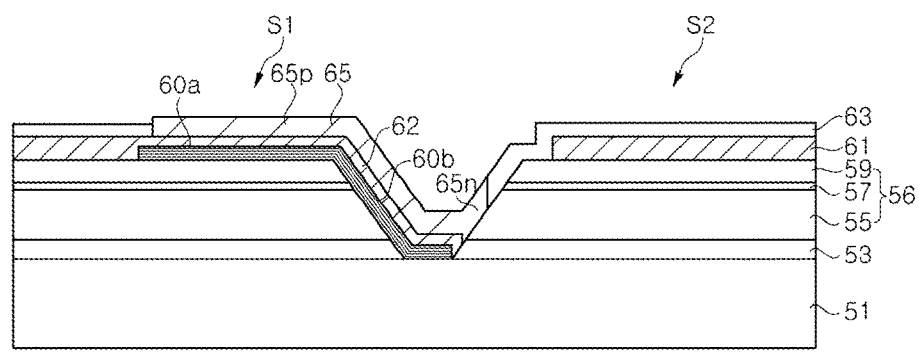
FIG. 26 is a schematic plan view of a light emitting diode according to an exemplary embodiment of the present invention.

FIG. 26 is a schematic sectional view of a light emitting diode according to an exemplary embodiment of the present invention.

Referring to FIG. 26, the light emitting diode according to the present exemplary embodiment is generally similar to the light emitting device described with reference to FIG. 17 and FIG. 18, and further includes a transparent conductive layer 62.

In the light emitting diode according to this embodiment, a substrate 51, light emitting cells S1, S2, a buffer layer 53, a transparent electrode layer 61, a current blocking layer 60a, an insulation layer 60b, an insulation protective layer 63 and an interconnection 65 are similar to those of the light emitting diode according to the above embodiment described with reference to FIG. 17 and FIG. 18, and detailed descriptions thereof will be omitted.

The transparent conductive layer 62 is disposed between the insulation layer 60b and the interconnection 65. The transparent conductive layer 62 has a narrower line width than the insulation layer 60b, thereby preventing short circuit of the upper semiconductor layer 59 and the lower semiconductor layer 55 due to the transparent conductive layer 62.

On the other hand, the transparent conductive layer 62 is connected to the first transparent electrode layer 61, and may connect the first transparent electrode layer 61 to the second light emitting cell S2. For example, one end of the transparent conductive layer 62 may be electrically connected to the lower semiconductor layer 55 of the second light emitting cell. In addition, when two or more light emitting cells are connected to each other, a second transparent conductive layer 62 may extend from a second transparent electrode layer 61 on the second light emitting cell S2.

In this embodiment, since the transparent conductive layer 62 is disposed between the interconnection 65 and the insulation layer 60b, electric current can flow through the transparent conductive layer 62 even in the case where the interconnection 65 is disconnected, thereby improving electric stability of the light emitting diode.

FIG. 27 to FIG. 30 are schematic sectional views illustrating a method of fabricating a light emitting diode according to the exemplary embodiment of FIG. 26.

Figure 27:
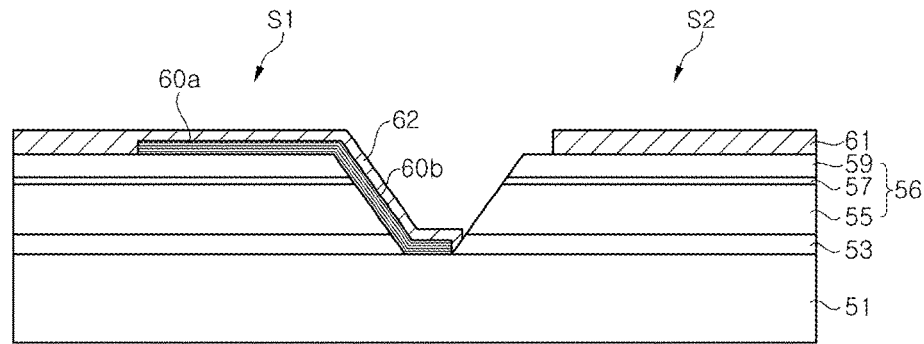
FIG. 27, FIG. 28, FIG. 29, and to FIG. 30 are schematic sectional views illustrating a method of fabricating a light emitting diode according to the exemplary embodiment of FIG. 26.

Referring to FIG. 27, as in the method described with reference to FIG. 19 and FIG. 20, a semiconductor stack structure 56 is formed on a substrate 51 and a plurality of light emitting cells S1, S2 is formed to be separated from each other via photolithography and etching. Then, as described with reference to FIG. 21, a current blocking layer 60a covering a partial area of the first light emitting cell S1 is formed together with an insulation layer 60b covering a partial area of a side surface of the first light emitting cell S1.

As described with reference to FIG. 21, the current blocking layer 60a and the insulation layer 60b may be formed as distributed Bragg reflectors by alternately stacking layers having different indices of refraction, for example, a $SiO_2$ layer and a $TiO_2$ layer. When the insulation layer 60b is a distributed Bragg reflector formed of multiple layers, it is possible to prevent formation of defects such as pinholes in the insulation layer 60b, whereby the insulation layer 60b may be formed to be relatively thin as compared with conventional techniques.

Next, a transparent electrode layer 61 is formed on the first and second light emitting cells S1, S2. As described with reference to FIG. 21, the transparent electrode layer 61 may be formed of a conductive material such as indium tin oxide (ITO) or zinc oxide, or a metal layer such as Ni/Au. The transparent electrode layer 61 is connected to the upper semiconductor layer 59 and is partially disposed on the current blocking layer 60a. The transparent electrode layer 61 may be formed by a lift-off process, without being limited thereto. Alternatively, the transparent electrode layer 61 may be formed by photolithography and etching.

During formation of the transparent electrode layer 61, a transparent conductive layer 62 is also formed. The transparent conductive layer 62 may be formed of the same material as that of the transparent electrode layer 61 through the same process. The transparent conductive layer 62 is formed on the insulation layer 60b, and may be connected to the transparent electrode layer 61. Further, one end of the transparent conductive layer 62 may be electrically connected to an inclined side surface of the lower semiconductor layer 55 of the second light emitting cell S2.

Figure 28:
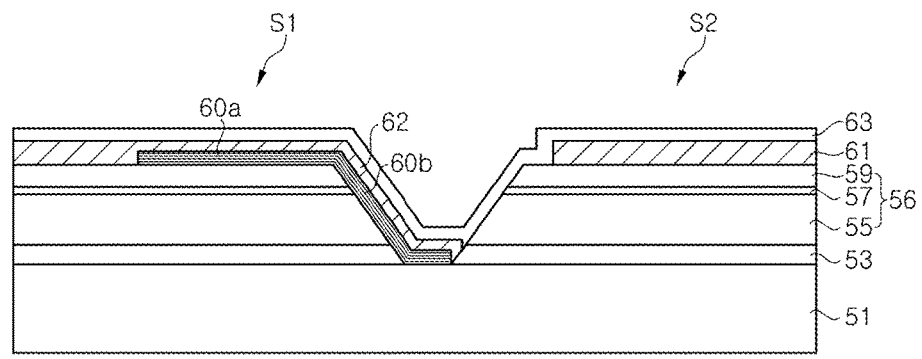

Referring to FIG. 28, an insulation protective layer 63 is formed to cover the first and second light emitting cells S1, S2. The insulation protective layer 63 covers the transparent electrode layer 61, the transparent conductive layer 62 and the insulation layer 60b. In addition, the insulation protective layer 63 may cover an overall area of the first and second light emitting cells S1, S2. The insulation protective layer 63 may be formed as an insulation material layer such as a silicon oxide layer or a silicon nitride layer by chemical vapor deposition or the like.

Figure 29:
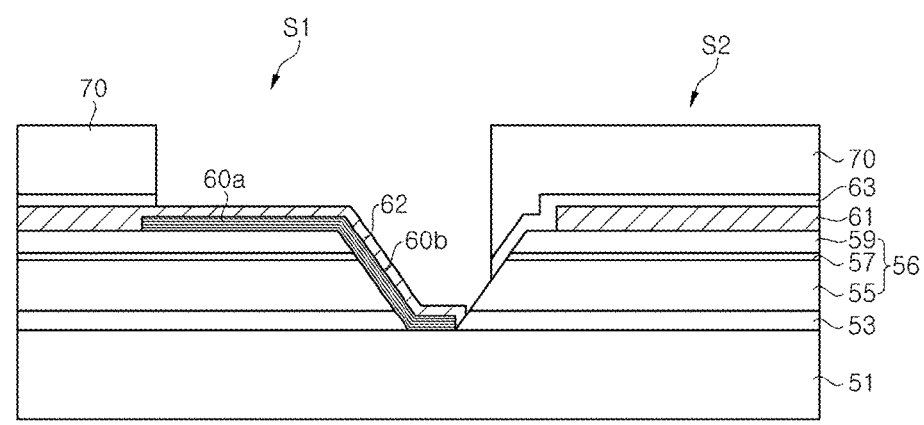

Referring to FIG. 29, as described with reference to FIG. 23, a mask pattern 70 having an opening is formed on the insulation protective layer 63. The opening of the mask pattern 70 corresponds to an area of the interconnection. Next, some region of the insulation protective layer 63 is etched using the mask pattern 70 as a mask. As a result, an opening is formed in the insulation protective layer 63 to expose some of the transparent electrode layer 61 and the transparent conductive layer 62, and the inclined side surface of the lower semiconductor layer 55 of the second light emitting cell S2 therethrough. A portion of the insulation layer 60b is exposed through the opening. Further, a portion of the insulation layer 60b is exposed through the opening.

Figure 30:
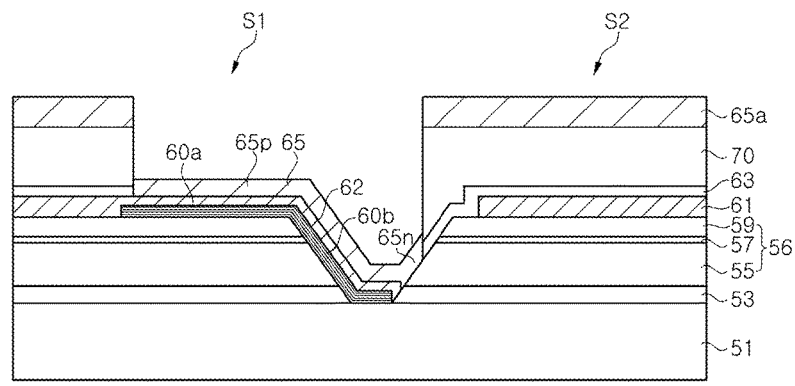

Referring to FIG. 30, as described with reference to FIG. 24, with the mask pattern 70 remaining on the insulation protective layer 63, a conductive material is deposited to form an interconnection 65 in the opening of the mask pattern 70.

Next, as described with reference to FIG. 25, the mask pattern 70 is removed together with a portion 65a of the conductive material on the mask pattern 70. Accordingly, the interconnection 65 electrically connecting the first and second light emitting cells S1, S2 to each other is finally formed.

In the embodiment described with reference to FIG. 19 to FIG. 25, the insulation layer 60b may be damaged during etching of the insulation protective layer 63. For example, when the insulation protective layer 63 is subjected to etching using an etching solution such as fluoric acid, the insulation layer 60b including an oxide layer may be damaged by the etching solution. Thus, the insulation layer 60b may not insulate the interconnection 65 from the first light emitting cell S1, thereby causing short circuit.

In the present exemplary embodiment, since the transparent conductive layer 62 is disposed on the insulation layer 60b, the insulation layer 60b under the transparent conductive layer 62 can be protected from etching damage. Thus, it is possible to prevent short circuit due to the interconnection 65.

In this embodiment, the transparent electrode layer 61 and the transparent conductive layer 62 may be formed by the same process. Thus, the light emitting diode can be fabricated using the same number of exposure processes while adding the transparent conductive layer 62.

Figure 31:
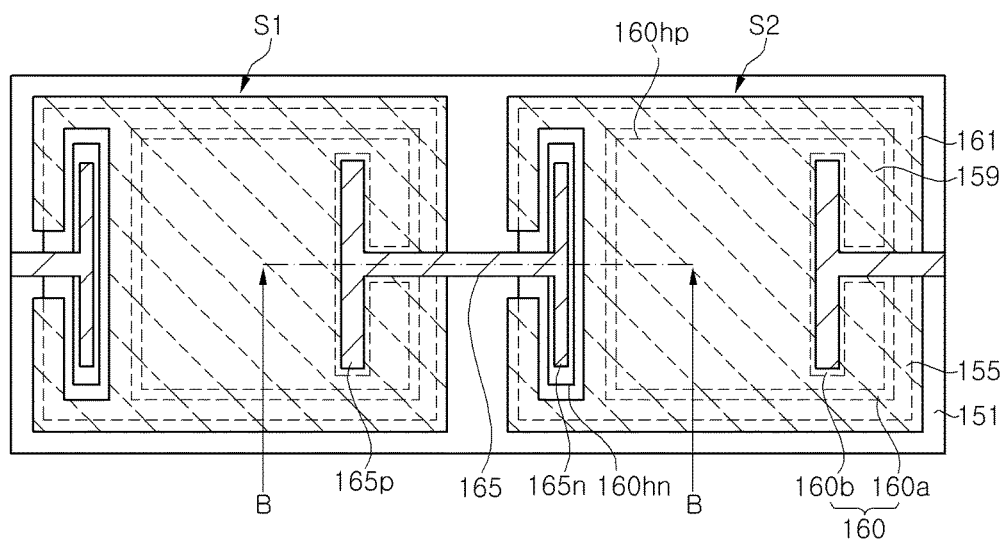
FIG. 31 is a schematic plan view of a light emitting diode according to an exemplary embodiment of the present invention.
Figure 32:
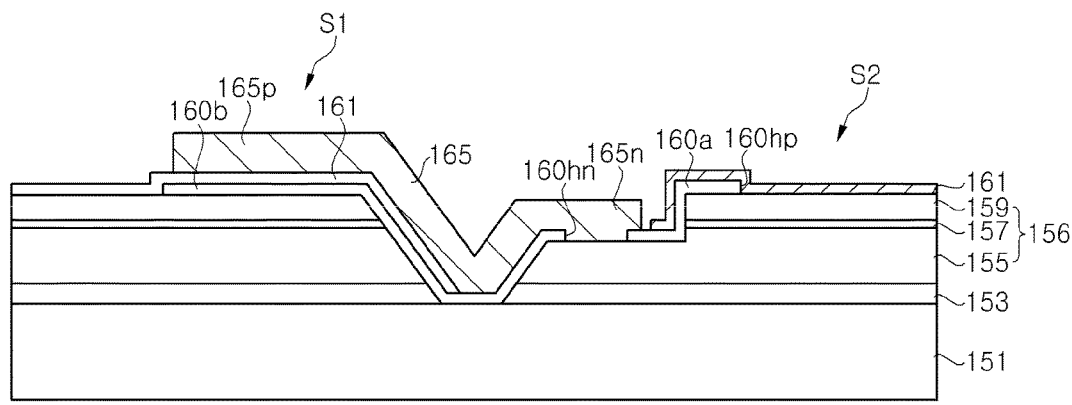
FIG. 32 is a schematic sectional view taken along line B-B of FIG. 31.

FIG. 31 is a schematic plan view of a light emitting diode according to an exemplary embodiment of the present invention, and FIG. 32 is a schematic sectional view taken along line B-B of FIG. 31.

Referring to FIG. 31 and FIG. 32, the light emitting diode includes a substrate 151, light emitting cells S1, S2, a first insulation layer 160a, a second insulation layer 160b, a transparent electrode layer 161, and an interconnection 165. The light emitting diode may further include a buffer layer 153.

The substrate 151 may be an insulating or conductive substrate. For example, the substrate 151 may be a sapphire substrate, a gallium nitride substrate, a silicon carbide (SiC) substrate, or a silicon substrate. In addition, the substrate 151 may be a substrate having a convex-concave pattern (not shown) on an upper surface thereof, such as a patterned sapphire substrate.

On a single substrate 151, the first light emitting cell S1 and the second light emitting cell S2 are separated from each other. The first and second light emitting cells S1, S2 may be composed of a gallium nitride semiconductor. Each of the first and second light emitting cells S1, S2 has a stack structure 156, which includes a lower semiconductor layer 155, an upper semiconductor layer 159 disposed on one area of the lower semiconductor layer, and an active layer 157 interposed between the lower semiconductor layer and the upper semiconductor layer. Here, the lower and upper semiconductor layers 155, 159 may be p-type and n-type semiconductor layers, respectively, or vice versa.

Each of the lower semiconductor layer 155, the active layer 157 and the upper semiconductor layer 159 may be formed of a gallium nitride-based material, for example, (Al, In, Ga)N. The active layer 157 may be formed of a material having a composition capable of emitting light in a desired wavelength range, for example, UV or blue light, and the lower and upper semiconductor layers 155, 159 are formed of a material having a wider band gap than that of the active layer 157.

As shown, the lower semiconductor layer 155 and/or the upper semiconductor layer 159 may be formed of a single layer or multiple layers. In addition, the active layer 157 may have a single quantum-well structure or a multi-quantum well structure.

Each of the first and second light emitting cells S1, S2 may have an inclined side surface, an inclined angle of which ranges from 15° to 80° with respect to an upper surface of the substrate 151.

The active layer 157 and the upper semiconductor layer 159 may be placed on some region of the lower semiconductor layer 155, and the other region of the lower semiconductor layer 155 may be exposed, as shown in FIG. 32. Alternatively, an upper surface of the lower semiconductor layer 155 may be completely covered by the active layer 157 such that a side surface of the lower semiconductor layer 155 is exposed.

In FIG. 32, the first light emitting cell S1 and the second light emitting cell S2 are partially shown. However, it should be noted that the first light emitting cell S1 and the second light emitting cell S2 may have a similar or the same structure, as shown in FIG. 31. Specifically, the first and second light emitting cells S1, S2 may have the same gallium nitride-based semiconductor stack structure, and may have inclined side surfaces of the same structure.

The buffer layer 153 may be interposed between the light emitting cells S1, S2 and the substrate 151. The buffer layer 153 is used to relieve lattice mismatch between the substrate 151 and the lower semiconductor layer 155 formed thereon, when the substrate 151 is a growth substrate.

The transparent electrode layer 161 is disposed on each of the light emitting cells S1, S2. Specifically, a first transparent electrode layer 161 is disposed on the first light emitting cell S1, and a second transparent electrode layer 161 is disposed on the second light emitting cell S2. The transparent electrode layer 161 may be disposed on an upper surface of the upper semiconductor layer 159 to be connected to the upper semiconductor layer 159.

The first and/or the second transparent electrode layers 161 may cover a portion of the side surfaces of the first and/or second light emitting cells S1, S2, and may cover at least three surfaces thereof. In the embodiment shown in FIG. 31, each of the first and second transparent electrode layers 161 covers four side surfaces of the first or second light emitting cell S1 or S2.

Accordingly, the transparent electrode layer 161 may have a wider area than an upper area of the corresponding light emitting cell S1 or S2. In addition, the transparent electrode layer 161 may cover the entirety of the upper surface of the upper semiconductor layer 159. The transparent electrode layer 161 has a wider area than that of the corresponding light emitting cell S1 or S2, whereby resistance of the transparent electrode layer 161 can be reduced. The transparent electrode layer 161 placed on the second light emitting cell S2 adjoins the upper semiconductor layer 159 of the second light emitting cell S2 and is insulated from the lower semiconductor layer 155 of the second light emitting cell S2 by the first insulation layer 160a. Namely, the transparent electrode layer 161 may adjoin an exposed region of the upper semiconductor layer 159 and may be placed on the first insulation layer 160a covering an exposed region of the lower semiconductor layer 155.

The first insulation layer 160a separates the transparent electrode layer 161 from the side surface of the corresponding light emitting cell S1 or S2 to prevent the light emitting cell S1 or S2 from being electrically disconnected from the transparent electrode layer 161. The first insulation layer 160a may cover the side surface of the corresponding light emitting cell S1 or S2 along an edge of the corresponding light emitting cell. In addition, the first insulation layer 160a may cover the upper surface of the substrate 151 around the light emitting cells S1, S2. On the other hand, the first insulation layer 160a has an opening 160hn that exposes the lower semiconductor layer 155 and an opening 160hp that exposes the upper semiconductor layer 159. The transparent electrode layer 161 is connected to the upper semiconductor layer 159 through the opening 160hp formed on an upper surface of each of the light emitting cells S1, S2. As the first insulation layer 160a is formed along an edge of the upper surface of the upper semiconductor layer 159, the transparent electrode layer 161 may be recessed from the edge of the upper semiconductor layer 159 to be connected to the upper semiconductor layer 159. Thus, the light emitting diode according to this embodiment can prevent current crowding at the edge of the upper semiconductor layer 159 through sidewalls of the light emitting cells S1, S2.

The second insulation layer 160b may be formed on each of the light emitting cells S1, S2 to be placed between the transparent electrode layer 161 and the light emitting cells S1, S2. A portion of the transparent electrode layer 161 is placed on the second insulation layer 160b. The second insulation layer 160b may be disposed near an edge of each of the light emitting cells S1, S2, without being limited thereto. Alternatively, the second insulation layer 160b may be disposed at a central region of each of the light emitting cells S1, S2. The second insulation layer 160b may be formed of the same material, for example, silicon oxide or silicon nitride, as that of the first insulation layer 160a.

The interconnection 165 electrically connects the first light emitting cell S1 to the second light emitting cell S2. The interconnection 165 includes a first connection section (one end) 165p and a second connection section (the other end) 165n. The first connection section 165p is electrically connected to the transparent electrode layer 161 on the first light emitting cell S1, and the second connection section 165n is electrically connected to the lower semiconductor layer 155 of the second light emitting cell S2. Particularly, the second connection section 165n may be connected to the lower semiconductor layer 155 through the opening 160hn of the first insulation layer 160a. The first light emitting cell S1 is connected in series to the second light emitting cell S2 through the first and second connection sections 165p, 165n of the interconnection 165.

On the other hand, the first connection section 165p may be disposed near one edge of the first light emitting cell S1, without being limited thereto. Alternatively, the first connection section 165p may be disposed at the central region of the first light emitting cell S1.

The interconnection 165 may contact the transparent electrode layer 161 over an entire overlapping area between the interconnection 165 and the transparent electrode layer 161. In the related art, a portion of the insulation layer 133 is disposed between the transparent electrode layer 131 and the interconnection 135. However, in this embodiment, the interconnection 165 directly contacts the transparent electrode layer 161 without any insulating material interposed therebetween.

Further, the second insulation layer 160b may be disposed over the entire overlapping area between the interconnection 165 and the transparent electrode layer 161 on the first light emitting cell S1.

In this embodiment, the second connection section 165n is connected to the exposed upper side of the lower semiconductor layer 155. Alternatively, the second connection section 165n may be connected to an inclined side surface of the second light emitting cell S2, particularly, an inclined side surface of the lower semiconductor layer 155 of the second light emitting cell S2. In this case, there is no need for exposure of the upper surface of the lower semiconductor layer 155, and the first insulation layer 160a is formed to expose the inclined side surface of the lower semiconductor layer 155.

In this embodiment, the light emitting diode is illustrated as including two light emitting cells, that is, the first light emitting cell S1 and the second light emitting cell S2. However, the present invention is not limited thereto, and more light emitting cells may be electrically connected to each other by the interconnections 165. For example, the interconnections 165 may electrically connect the lower semiconductor layers 155 of adjacent light emitting cells to the transparent electrode layers 161 thereof to form a series array of light emitting cells. Although the light emitting diode may have a single series array formed on a single substrate 151, the present invention is not limited thereto. Alternatively, the light emitting diode may include a plurality of series arrays, which are connected to each other in parallel or in reverse parallel. In addition, the light emitting diode may be provided with a bridge rectifier (not shown) connected to the series array of light emitting cells, such that the light emitting cells can be driven by an AC source. The bridge rectifier may be formed by connecting the light emitting cells having the same structure as that of the light emitting cells S1, S2 using the interconnections 165.

FIG. 33 to FIG. 37 are sectional views illustrating a method of fabricating a light emitting diode according to the exemplary embodiment of FIG. 31.

Figure 33:
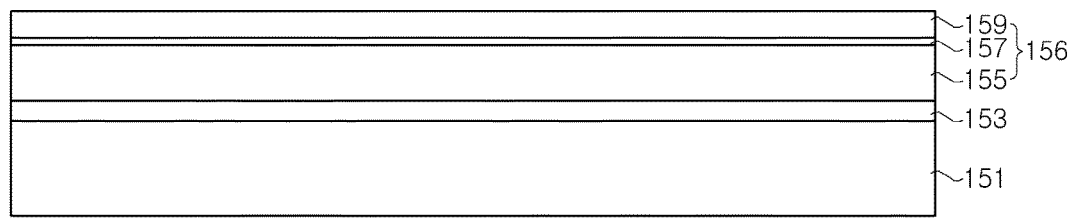
FIG. 33, FIG. 34, FIG. 35, FIG. 36, and to FIG. 37 are schematic sectional views illustrating a method of fabricating a light emitting diode according to the exemplary embodiment of FIG. 31.

Referring to FIG. 33, a semiconductor stack structure 156 is formed on a substrate 151, and includes a lower semiconductor layer 155, an active layer 157 and an upper semiconductor layer 159. In addition, before formation of the lower semiconductor layer 155, a buffer layer 153 may be formed on the substrate 151.

The substrate 151 may be a sapphire ($Al_2O_3$) substrate, a silicon carbide (SiC) substrate, a zinc oxide (ZnO) substrate, a silicon (Si) substrate, a gallium arsenide (GaAs) substrate, a gallium phosphide (GaP) substrate, a lithium alumina ($LiAl_2O_3$) substrate, a boron nitride (BN) substrate, an aluminum nitride (AlN) substrate, or a gallium nitride (GaN) substrate, without being limited thereto. That is, the substrate 151 may be formed of a material selected from among various materials dependent upon materials of semiconductor layers to be formed thereon. In addition, the substrate 151 may be a substrate having a convex-concave pattern on an upper surface thereof, such as a patterned sapphire substrate.

The buffer layer 153 is formed to relieve lattice mismatch between the substrate 151 and the lower semiconductor layer 155 formed thereon, and may be formed of, for example, gallium nitride (GaN) or aluminum nitride (AlN). When the substrate 51 is a conductive substrate, the buffer layer 153 may be formed as an insulation layer or a semi-insulation layer, for example, AN or semi-insulation GaN.

Each of the lower semiconductor layer 155, the active layer 157 and the upper semiconductor layer 159 may be formed of a gallium nitride-based semiconductor material, for example, (Al, In, Ga)N. The lower and upper semiconductor layers 155, 159 and the active layer 157 may be discontinuously or continuously formed by metal organic chemical vapor deposition (MOCVD), molecular beam epitaxy, hydride vapor phase epitaxy (HYPE), and the like.

Here, the lower and upper semiconductor layers may be n-type and p-type semiconductor layers, respectively, or vice versa. The n-type semiconductor layer may be formed by doping a gallium nitride-based compound semiconductor layer with, for example, silicon (Si) impurities, and the p-type semiconductor layer may be formed by doping the gallium nitride-based compound semiconductor layer with, for example, magnesium (Mg) impurities.

Figure 34:
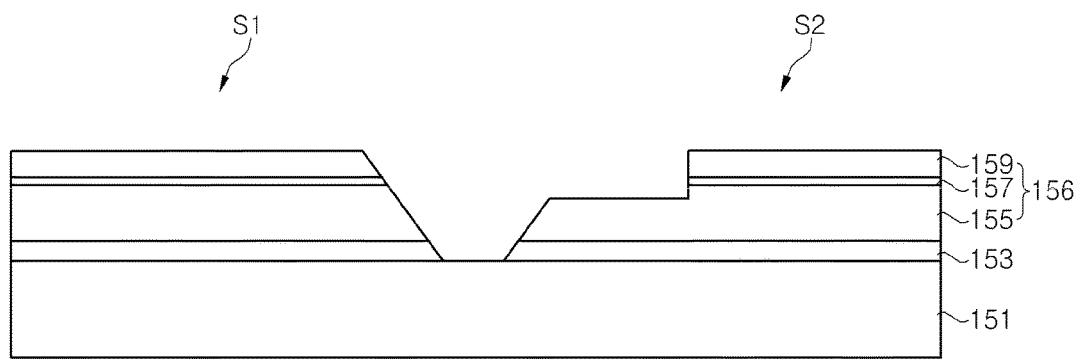

Referring to FIG. 34, a plurality of light emitting cells S1, S2 is formed to be separated from each other by photolithography and etching. Each of the light emitting cells S1, S2 may be formed to have an inclined side surface, and an upper surface of the lower semiconductor layer 155 of each of the light emitting cells S1, S2 is partially exposed.

In each of the light emitting cells S1, S2, the lower semiconductor layer 155 is first exposed by mesa-etching, and the light emitting cells are separated from each other by a cell isolation process. Alternatively, the light emitting cells S1, S2 may be first separated from each other by the cell isolation process, and then are subjected to mesa etching to expose the lower semiconductor layers 155 thereof.

When an interconnection is connected to an inclined side surface, mesa etching for exposing the upper surface of the lower semiconductor layer 155 may be omitted.

Figure 35:
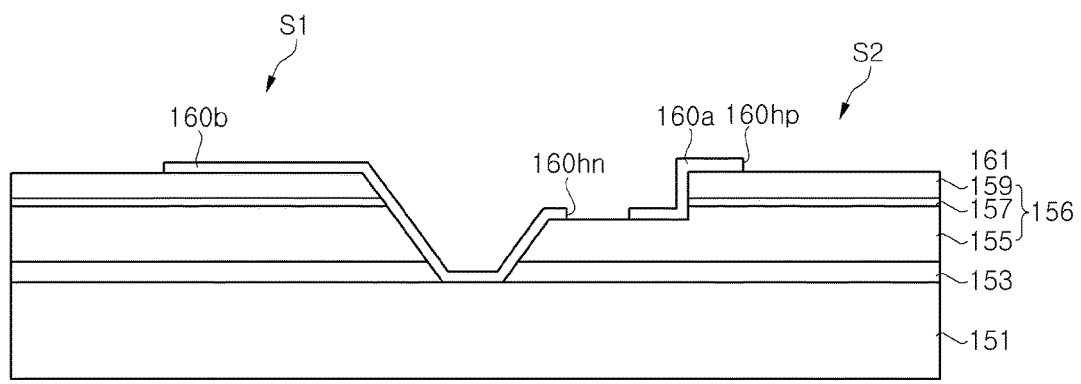

Referring to FIG. 35, a second insulation layer 160b covering some region of the first light emitting cell S1 is formed together with a first insulation layer 160a covering a side surface of the first light emitting cell S1. The first insulation layer 160a may extend to cover a region between the first light emitting cell S1 and the second light emitting cell S2. The first insulation layer 160a has an opening 160hp exposing the upper semiconductor layer 159 and an opening 160hn exposing the lower semiconductor layer 155. On the other hand, the first insulation layer 160a may be connected to the second insulation layer 160b, but the present invention is not limited thereto. In some embodiments, the first insulation layer 160a may be separated from the second insulation layer 160b.

The first insulation layer 160a and the second insulation layer 160b may be formed of silicon oxide or silicon nitride by the same process at the same time. For example, the first and second insulation layers 160a, 160b may be formed by depositing an insulating material, followed by patterning through photolithography and etching.

Figure 36:
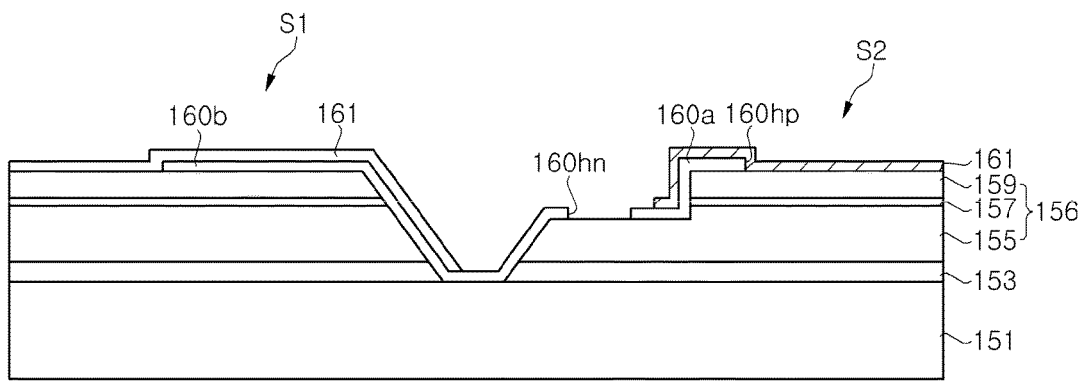

Next, referring to FIG. 36, a transparent electrode layer 161 is formed on the first and second light emitting cells S1, S2. The transparent electrode layer 161 is formed of a conductive oxide such as indium tin oxide (ITO) or zinc oxide, or a metal layer such as Ni/Au. The transparent electrode layer 161 is connected to the upper semiconductor layer 159 through the opening 160hp and covers the second insulation layer 160b.

In addition, the transparent electrode layer 161 covers side surfaces of the light emitting cells S1, S2. The transparent electrode layer 161 may also cover at least three side surfaces of the corresponding light emitting cell S1 or S2. Here, the transparent electrode layer 161 is formed outside the opening 160hn such that the lower semiconductor layer 155 is exposed.

On the other hand, the transparent electrode layer 161 is separated from the side surface of the light emitting cell S1 or S2 by the first insulation layer 160a. In addition, a first transparent electrode layer 161 on the first light emitting cell S1 is separated from a second transparent electrode layer 161 on the second light emitting cell S2, and may be separated from the second light emitting cell S2.

The transparent electrode layer 161 may be formed by a lift-off process, without being limited thereto. Alternatively, the transparent electrode layer 161 may be formed by photolithography and etching.

Figure 37:
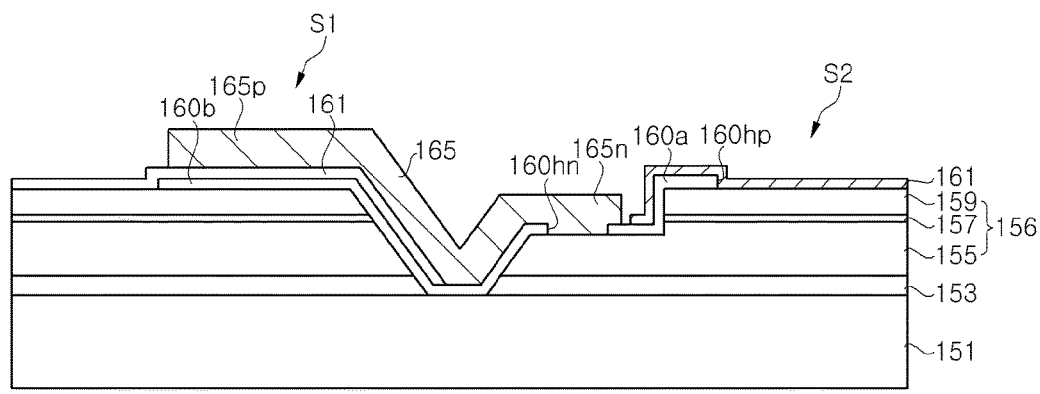

Referring to FIG. 37, an interconnection 165 is formed on the transparent electrode layer 161. The interconnection 165 includes a first connection section 165p and a second connection section 165n, in which the first connection section 165p is connected to the first transparent electrode layer 161 of the first light emitting cell S1 and the second connection section 165n is connected to the lower semiconductor layer 155 of the second light emitting cell S2. The interconnection 165 may be formed by a lift-off process.

According to this embodiment, the first insulation layer 160a and the second insulation layer 160b may be formed at the same time, thereby simplifying the fabrication process. Furthermore, the method according to this embodiment does not include an etching process using BOE after formation of the first and second insulation layers 160a, 160b, thereby preventing damage to the first and second insulation layers 160a, 160b in a subsequent process using BOE or the like.

Figure 38:
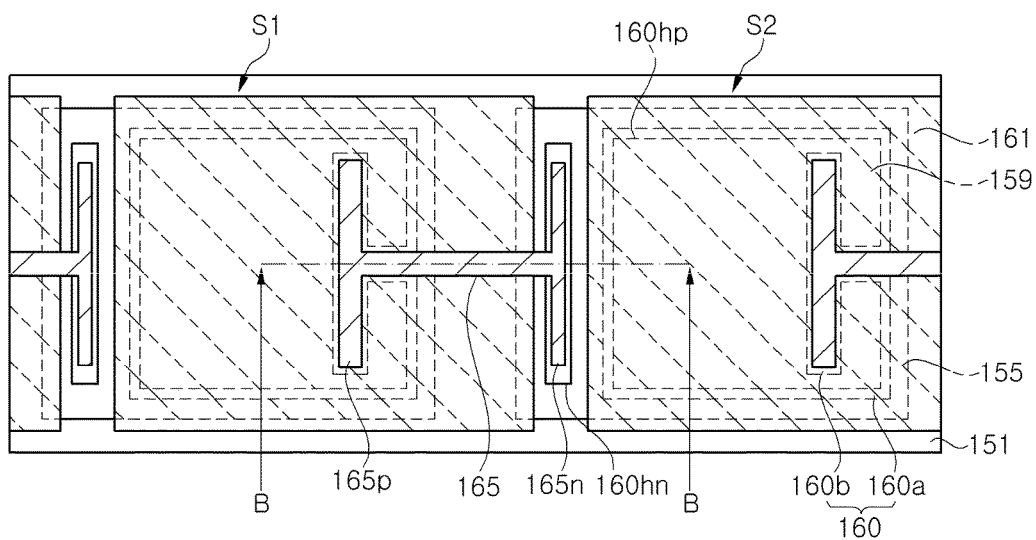
FIG. 38 is a schematic sectional view of a light emitting diode according to an exemplary embodiment of the present invention.
Figure 39:
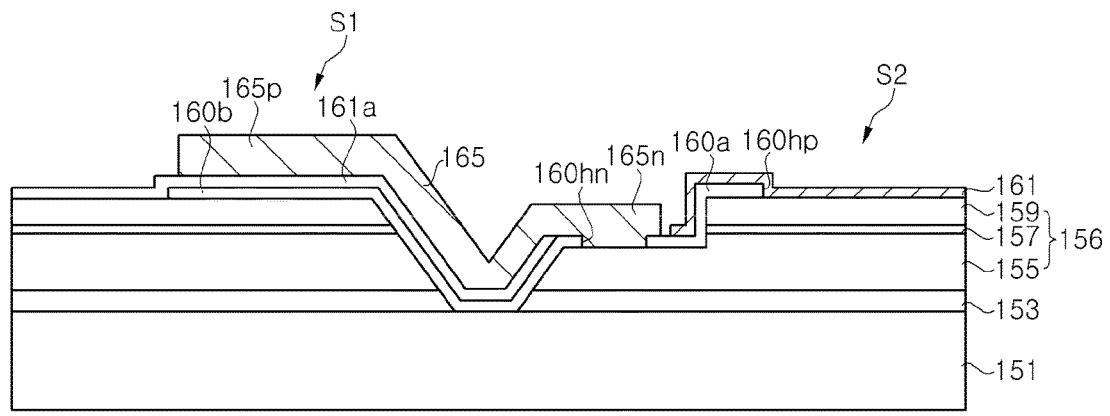
FIG. 39 is a schematic sectional view taken along line B-B of FIG. 38.

FIG. 38 is a sectional view of a light emitting diode according to another exemplary embodiment of the present invention, and FIG. 39 is a sectional view taken along line B-B of FIG. 38.

Referring to FIG. 38 and FIG. 39, the light emitting diode according to this embodiment is generally similar to the light emitting diode illustrated with reference to FIG. 31 and FIG. 32 excluding a location of the transparent electrode layer 161.

Namely, in the embodiment shown in FIG. 31 and FIG. 32, the transparent electrode layer 161 is formed to cover four side surfaces of the corresponding light emitting cell S1 or S2, and is separated from an adjacent light emitting cell. On the contrary, in this embodiment, the first transparent electrode layer 161 covers three side surfaces of the first light emitting cell S1 while extending to cover a portion of the side surface of the second light emitting cell S2.

The first transparent electrode layer 161 may be connected to the lower semiconductor layer 155 of the second light emitting cell S2. However, the first transparent electrode layer 161 is separated from the second transparent electrode layer and is also separated from the upper semiconductor layer 159 of the second light emitting cell S2.

According to this embodiment, current can be supplied between adjacent light emitting cells S1, S2 using the transparent electrode layer 161, thereby further reducing forward voltage of the light emitting diode.

A description of a method fabricating the light emitting diode according to this embodiment of the invention will be omitted to avoid repetition.

Although various embodiments have been described above, the present invention is not limited thereto, and various modification, changes, and alterations can be made without departing from the scope of the present invention.

Figure 40:
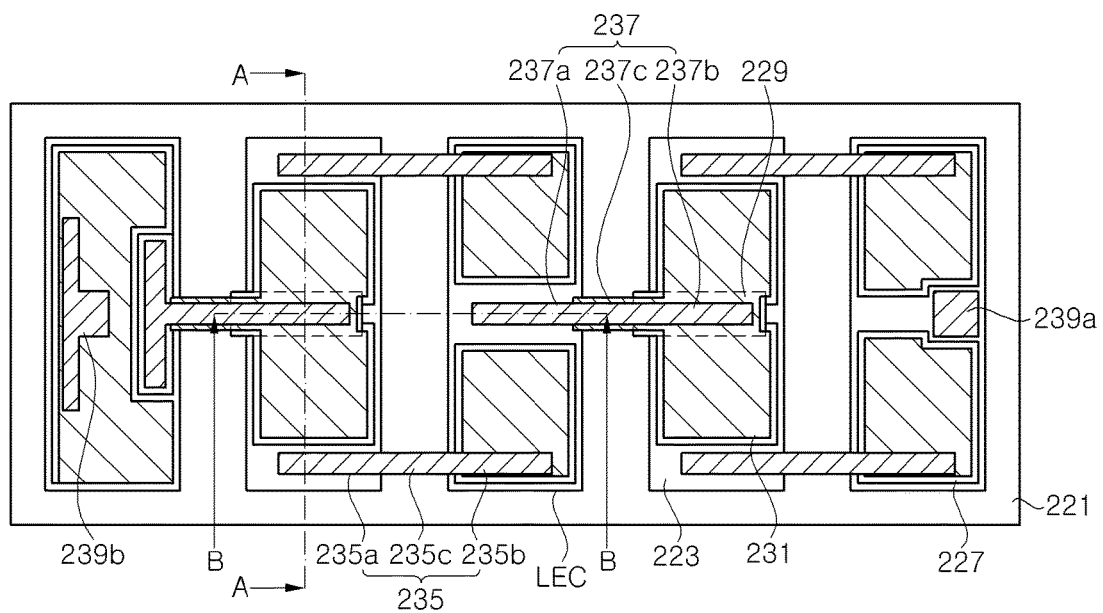
FIG. 40 is a schematic plan view of a light emitting diode according to an exemplary embodiment of the present invention.
Figure 41A:
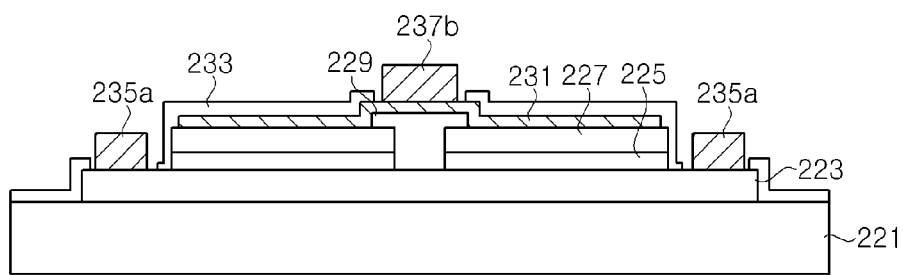
FIG. 41A and FIG. 41B are sectional views taken along lines A-A and B-B of FIG. 40.
Figure 41B:
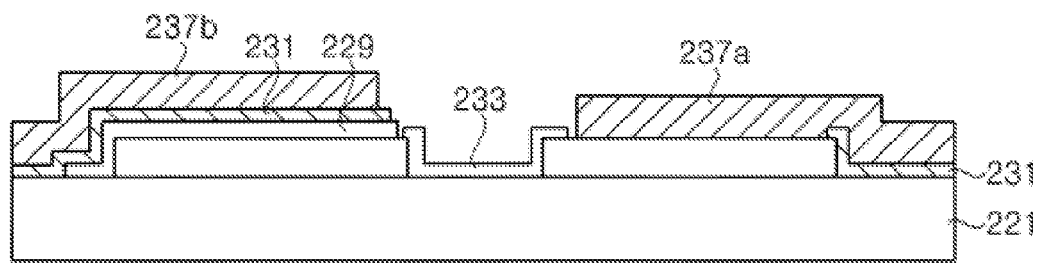
Figure 42:
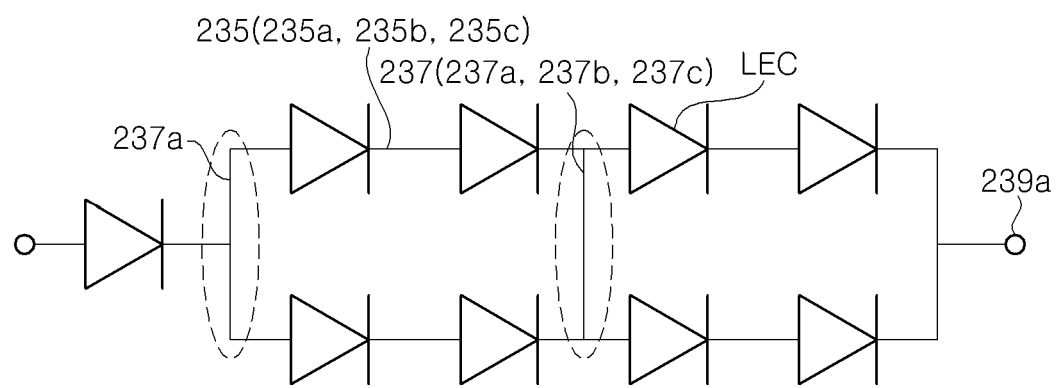
FIG. 42 is a schematic circuit diagram of the light emitting diode of FIG. 40.

FIG. 40 is a schematic plan view of a light emitting diode according to an exemplary embodiment of the present invention, FIG. 41a and FIG. 41b are sectional views taken along lines A-A and B-B of FIG. 40, and FIG. 42 is a schematic circuit diagram of the light emitting diode of FIG. 40.

Referring to FIG. 40 to FIG. 42, the light emitting diode includes a substrate 221, a plurality of light emitting cells LEC, a current blocking layer 229, a transparent electrode layer 231, an insulation protective layer 233, first interconnections 235, second interconnections 237, a first electrode pad 239a, and a second electrode pad 239b.

The substrate 221 serves to support the light emitting cells LEC, and may be a growth substrate for growing a nitride semiconductor layer, such as a sapphire substrate, a silicon substrate, and a GaN substrate, without being limited thereto. The substrate 221 typically means a substrate in a light emitting diode chip.

The plural light emitting cells LEC are arranged on the substrate 221. As shown in FIG. 41a and FIG. 41b, each of the light emitting cells LEC includes a first conductive type semiconductor layer 223, an active layer 225, and a second conductive type semiconductor layer 227. Herein, the first and second conductive type semiconductor layers 223, 227 may be n-type and p-type semiconductor layers, respectively, or vice versa. The active layer 225 is placed between the first conductive type semiconductor layer 223 and the second conductive type semiconductor layer 227, and may have a single quantum well structure or a multi-quantum well structure. A material and composition of the active layer 225 are determined dependent on a desired wavelength of light. For example, the active layer 225 may be formed of an AlInGaN-based compound semiconductor, for example, InGaN. The first and second conductive type semiconductor layers 223, 227 are composed of an AlInGaN-based compound semiconductor, which has a wider band gap than that of the active layer 225, for example, GaN. On the other hand, a buffer layer (not shown) may be interposed between the first conductive type semiconductor layer 223 and the substrate 221.

The first conductive type semiconductor layer 223, active layer 225 and second conductive type semiconductor layer 227 may be grown on the substrate 221 by metal organic chemical vapor deposition, followed by patterning through photolithography and etching.

As shown in FIG. 40 and FIG. 41a, the active layer 225 may be disposed on the first conductive type semiconductor layer 223 and the second conductive type semiconductor layer 227 may be disposed on the active layer 225. The active layer 225 and the second conductive type semiconductor layer 227 form a partial stack structure that may be divided into two portions or two light emitting cells LEC. In other words, two light emitting cells LEC may share the first conductive type semiconductor layer 223.

The interconnections, that is, the first interconnections 235 and the second interconnections 237, electrically connect the light emitting cells LEC to each other. The first and second interconnections 235, 237 connect the light emitting cells LEC placed on different first conductive type semiconductor layers 223 to each other in series. The first interconnections 235 electrically connect the first conductive type semiconductor layer 223 of one light emitting cell to the second conductive type semiconductor layer 227 of an adjacent light emitting cell LEC through the transparent electrode 231 of the adjacent light emitting cell LED.

The first interconnection 235 includes a first connection section 235a (an anode) connected to the first conductive type semiconductor layer 223, a second connection section 235b (a cathode) placed on the transparent electrode 231 to be electrically connected to the second conductive type semiconductor layer 227 through the transparent electrode 231. The first interconnection 235 also includes an interconnecting section 235c interconnecting the first connection section 235a and the second connection section 235b.

The second interconnection 237 includes a first connection section 237a (a common anode) connected to the first conductive type semiconductor layer 223, a second connection section 237b (a common cathode) placed on the second conductive type semiconductor layer 227 to be electrically connected to the second conductive type semiconductor layer 227, and an interconnecting section 237c interconnecting the first connection section 237a and the second connection section 237b.

The common anode 237a is commonly connected to two light emitting cells LEC. For example, the common anode 237a is electrically connected to, for example, the first conductive type semiconductor layer shared by the two light emitting cells LEC. On the other hand, the common cathode 237b is commonly connected to the two light emitting cells 2LEC. For example, the common cathode 237b is electrically connected to the second conductive type semiconductor layers 227 placed on the shared first conductive type semiconductor layer 223. The common cathode 237b is placed on a region between the two light emitting cells 2LEC.

Although the first and second interconnections 235, 237 have been described above, it should be understood that the light emitting cells LEC may be connected to each other by various types of interconnections. For example, unlike the two first interconnections 235 that connect the first light emitting cell to two light emitting cells adjacent the first light emitting cell in FIG. 40, a single interconnection 235 may connect two adjacent light emitting cells, including the first light emitting cell and the second light emitting cell, to a different two light emitting cells (i.e., the third and fourth light emitting cells). Here, the modified first interconnection 235 may have a common cathode (positioned similar to common anode 237a) that commonly connects the third and fourth adjacent light emitting cells LEC via the first conductive type semiconductor layer 223 and a common anode (positioned similar to common cathode 237b) that commonly connects to the first and second light emitting cells LEC through the transparent electrode 231. In addition, the two modified second interconnections 237 may connect the adjacent third and fourth light emitting cells LEC to fifth and sixth light emitting cells LEC. Here, each modified second interconnection 237 may have an anode (positioned similar to the cathode 235b) that electrically connects to the second conductive type semiconductor layer 227 through the transparent electrode 231 of either the third or fourth light emitting cells LEC. Each modified second interconnection 237 may also have a cathode (positioned similar to the anode 235a) that electrically connects to the first conductive type semiconductor layer 223 of the fifth and sixth light emitting cells LEC.

Plural series arrays are formed by the interconnections 235, 237 and are connected to each other in parallel.

On the other hand, the transparent electrode layers 231 are connected to the second conductive type semiconductor layers 227 of the light emitting cells LEC. Although some of the transparent electrode layers 231 are restrictively placed on the corresponding light emitting cells, the other transparent electrode layers 231 may be continuously placed on the two light emitting cells LEC.

The cathodes 235b, 237b may be electrically connected to the second conductive type semiconductor layer 227 through the transparent electrode layer 231. Particularly, the common cathode 237b may be electrically connected to the two light emitting cells LEC at the same time through the transparent electrode layer 231 continuously placed on the two light emitting cells.

The current blocking layer 229 is placed below the common cathode 237b. Particularly, the current blocking layer 229 is placed under the transparent electrode layer 231 to separate the transparent electrode layer 231 from side surfaces of the light emitting cells 2LEC, particularly from the first conductive type semiconductor layer 223. Furthermore, the current blocking layer 229 may partially cover upper regions of the light emitting cells LEC. In addition, the current blocking layer (not shown) may be placed under the cathode 235b.

The current blocking layer 229 is formed of an insulation layer to prevent current crowding under the cathodes 235b, 237b. Furthermore, the current blocking layer 229 may include a distributed Bragg reflector. The distributed Bragg reflector, which reflects light emitted from the active layer 225, may be formed by repeatedly stacking layers having difference indexes of refraction, for example, $TiO_2/SiO_2$. As the current blocking layer 229 includes the distributed Bragg reflector, it is possible to prevent light generated from the active layer 225 from being absorbed into the interconnections 235, 237.

As shown in FIG. 40, a portion of the current blocking layer 229 may extend outside the first conductive type semiconductor layer 223. A portion of the interconnecting section 237c may be placed on the extended portion of the current blocking layer 229, and thus, the extended portion will reflect light traveling towards the interconnecting section 237c. On the other hand, the transparent electrode layer 231 may extend to cover the extended portion of the current blocking layer 229. Further, the transparent electrode layer 231 may further extend to cover a portion of an adjacent first conductive type semiconductor layer 223.

The first electrode pad 239a and the second electrode pad 239b are placed at opposite ends of the series arrays. The first and second electrode pads 239a, 239b may be respectively placed on the light emitting cells LEC at the opposite sides of the series arrays.

The insulation protective layer 233 may cover substantially the entirety of the light emitting diode excluding regions at which the interconnections 235, 237 and the electrode pads 239a, 239b will be formed. The insulation protective layer 233 may be formed to protect the light emitting diode from external moisture or external force.

According to this embodiment, as shown in FIG. 42, two series arrays of the light emitting cells LEC may be formed between the first electrode pad 239a and the second electrode pad 239b. In FIG. 42, one light emitting cell is placed at one end of the series arrays at which the second electrode pad 239b is placed, and two light emitting cells are placed at the other end thereof at which the first electrode pad 239a is placed. However, the present invention is not limited to this arrangement of the light emitting cells LEC. For example, one or two light emitting cells may be placed at either end of these arrays.

In addition, according to this embodiment, as indicated by a dotted line in FIG. 42, the common cathode 237b or the interconnection 237 including the common cathode 237b is provided to interconnect arrays, which are connected to each other in parallel. As a result, the light emitting cells connected to the common cathode have equivalent potential, thereby relieving current crowding on a certain array.

Although this embodiment has been illustrated as having four light emitting cells in a series array, the number of light emitting cells in the series array is not particularly limited so long as the series array includes one or more light emitting cells. In addition, the number of light emitting cells may be determined in various ways as needed or in consideration of available voltage.

Further, this embodiment has been illustrated as having a series-parallel structure in which two series arrays are formed on the substrate 221 by the interconnections and connected to each other in parallel. However, it should be understood that the number of series arrays formed on the substrate 221 is not limited thereto and more series arrays may be formed thereon.

Figure 43:
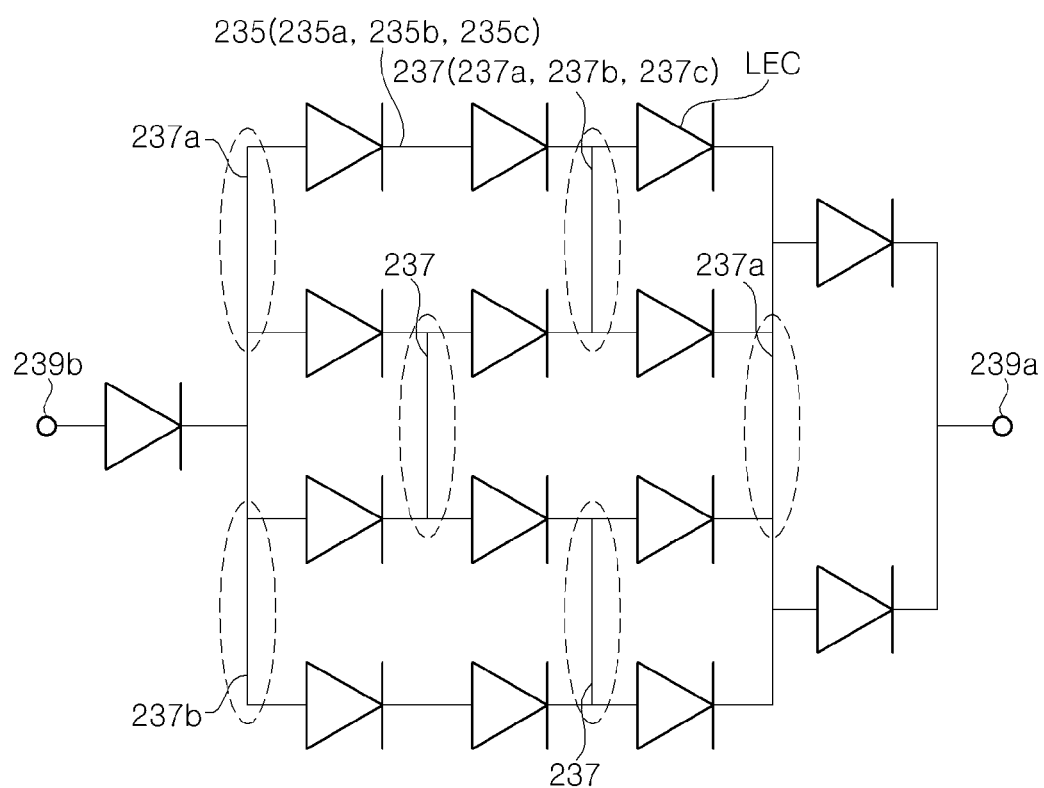
FIG. 43 is a schematic circuit diagram illustrating a light emitting diode according to an exemplary embodiment of the present invention.

FIG. 43 is a schematic circuit diagram illustrating a light emitting diode according to a further exemplary embodiment of the invention, in which four series arrays are formed.

Referring to FIG. 43, light emitting cells LEC are connected to each other by interconnections to form four series arrays, which are connected to each other in parallel between a first electrode pad 239a and a second electrode pad 239b. Light emitting cells having a larger area than light emitting cells within the series arrays may be disposed at opposite ends of the series arrays. In this embodiment, two light emitting cells are provided to the first electrode pad 239a and one light emitting cell is provided to the second electrode pad 239b. However, it should be understood that the present invention is not limited thereto and various numbers of light emitting cells may be provided to the opposite ends of the series arrays.

On the other hand, some of the light emitting cells LEC within adjacent series arrays are connected to each other by a common cathode 237b, and some of the light emitting cells are connected to each other by a common anode 237a. In addition, interconnections 237 including the common cathode 237b and the common anode 237a may connect adjacent light emitting cells to each other. Locations of the common cathode 237b and the common anode 237a are indicated by dotted lines. As described with reference to FIG. 40, the light emitting cells 2LEC including the common cathode 237b or the common anode 237a may share the first conductive type semiconductor layer 223. Furthermore, all adjacent light emitting cells between the respective series arrays may share the first conductive type semiconductor layer 223. For example, in this embodiment, first light emitting cells, second light emitting cells and third light emitting cells in the respective series arrays may share the first conductive type semiconductor layer 223.

Although this embodiment has been illustrated as having three light emitting cells arranged in each series array, the number of light emitting cells in the series array is not particularly limited so long as the series array includes one or more light emitting cells. Although the invention has been illustrated with reference to some embodiments in conjunction with the drawings, it will be apparent to those skilled in the art that various modifications and changes can be made to the invention without departing from the spirit and scope of the invention. Further, it should be understood that some features of a certain embodiment may also be applied to other embodiments without departing from the spirit and scope of the invention. Therefore, it should be understood that the embodiments are provided by way of illustration only and are given to provide complete disclosure of the invention and to provide thorough understanding of the invention to those skilled in the art. Thus, it is intended that the invention cover the modifications and variations provided they fall within the scope of the appended claims and their equivalents.

What is claimed is:

1. A light emitting diode, comprising:
   a first light emitting cell and a second light emitting cell separated from each other on a substrate;
   a first transparent electrode layer electrically connected to the first light emitting cell;
   a second transparent electrode layer electrically connected to the second light emitting cell;
   an interconnection electrically connecting the first light emitting cell to the second light emitting cell;
   a first insulation layer; and
   a second insulation layer,
   wherein:
   the second transparent electrode layer is disposed on an upper surface of the second light emitting cell for connection to the second light emitting cell while at least partially covering a side surface of the second light emitting cell;
   the first insulation layer separates the second transparent electrode layer from the side surface of the second light emitting cell,
   the first insulation layer comprises an opening configured to expose a lower semiconductor layer of the second light emitting cell,
   and the second insulation layer extends from the first insulation layer and is disposed between the interconnection and an upper surface of the first light emitting cell.

2. The light emitting diode of claim 1, wherein the second insulation layer comprises the same material as the first insulation layer.

3. The light emitting diode of claim 1, wherein:
   the second insulation layer is disposed under the first transparent electrode layer of the first light emitting cell; and
   the interconnection is connected to the first transparent electrode layer of the first light emitting cell on the top surface and the side surface of the first light emitting cell.

4. The light emitting diode of claim 1, wherein the first transparent electrode layer covers three side surfaces of the first light emitting cell.

5. The light emitting diode of claim 4, wherein a portion of the first transparent electrode layer partially covers a side surface of the second light emitting cell.

6. The light emitting diode of claim 1, wherein:
   each of the first and second light emitting cells comprises a lower semiconductor layer, an upper semiconductor layer, and an active layer disposed between the lower semiconductor layer and the upper semiconductor layer;
   the first transparent electrode layer is electrically connected to the upper semiconductor layer of the first light emitting cell; and
   a first end of the interconnection is electrically connected to the first transparent electrode layer and a second end of the interconnection is electrically connected to the lower semiconductor layer of the second light emitting cell.

7. The light emitting diode of claim 6, wherein the interconnection is directly connected to the first transparent electrode layer without an insulating material disposed over an entirety of an overlapping region therebetween.

8. The light emitting diode of claim 7, wherein the second insulation layer is disposed below a region to which the first transparent electrode layer and the interconnection are connected to the upper semiconductor layer of the first light emitting cell.

9. The light emitting diode of claim 6, wherein the first light emitting cell and the second light emitting cell comprise the same structure.

* * * * *